United States Patent
Kondo et al.

(10) Patent No.: US 8,731,012 B2
(45) Date of Patent: May 20, 2014

(54) SURFACE EMITTING SEMICONDUCTOR LASER AND ITS MANUFACTURING METHOD, SURFACE EMITTING SEMICONDUCTOR LASER DEVICE, OPTICAL TRANSMITTER, AND INFORMATION PROCESSOR

(71) Applicant: Fuji Xerox Co., Ltd., Tokyo (JP)

(72) Inventors: Takashi Kondo, Kanagawa (JP); Kazutaka Takeda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 21 days.

(21) Appl. No.: 13/654,020

(22) Filed: Oct. 17, 2012

(65) Prior Publication Data

US 2013/0188659 A1 Jul. 25, 2013

(30) Foreign Application Priority Data

Jan. 24, 2012 (JP) ................................. 2012-011724

(51) Int. Cl.
*H01S 3/10* (2006.01)
*H01S 3/13* (2006.01)
*H01S 3/04* (2006.01)
*H01S 5/00* (2006.01)

(52) U.S. Cl.
USPC ............... 372/24; 372/29.013; 372/43.01; 372/45.01; 372/46.013

(58) Field of Classification Search
USPC .......................................................... 372/24
See application file for complete search history.

(56) References Cited

U.S. PATENT DOCUMENTS

| | | | |
|---|---|---|---|
| 6,795,478 B2 * | 9/2004 | Hwang et al. ................... 372/96 |
| 6,931,042 B2 * | 8/2005 | Choquette et al. .......... 372/43.01 |
| 6,965,626 B2 * | 11/2005 | Tatum et al. ..................... 372/87 |
| 7,680,162 B2 * | 3/2010 | Park et al. ......................... 372/34 |
| 2003/0007528 A1 | 1/2003 | Uchiyama et al. |
| 2004/0076209 A1 * | 4/2004 | Bour et al. ........................ 372/45 |
| 2005/0100063 A1 * | 5/2005 | Wasserbauer et al. ........... 372/19 |
| 2005/0100068 A1 * | 5/2005 | Jikutani et al. ................... 372/46 |
| 2006/0227835 A1 * | 10/2006 | Ueki et al. ................ 372/50.124 |
| 2006/0285566 A1 * | 12/2006 | Ueki ........................... 372/45.01 |
| 2008/0279245 A1 | 11/2008 | Yamamoto et al. |
| 2011/0135318 A1 * | 6/2011 | Takeda et al. .................. 398/182 |
| 2011/0150500 A1 * | 6/2011 | Matsushita et al. ............ 398/182 |

FOREIGN PATENT DOCUMENTS

| | | | |
|---|---|---|---|
| JP | 2001-156395 A | 6/2001 |
| JP | 2003-069151 A | 3/2003 |
| JP | 2004-253408 A | 9/2004 |
| JP | 2005-259951 A | 9/2005 |
| JP | 2006-210429 A | 8/2006 |
| JP | 2008-283053 A | 11/2008 |

* cited by examiner

*Primary Examiner* — Xinning Niu
*Assistant Examiner* — Vu A Vu
(74) *Attorney, Agent, or Firm* — Sughrue Mion, PLLC

(57) ABSTRACT

A surface emitting semiconductor laser includes a substrate; a first semiconductor distributed bragg reflector of a first conductive type; an active region; a second semiconductor distributed bragg reflector of a second conductive type; a current confinement layer that confines current in the active region; an optical confinement layer that confines light in the active region; and an optical loss unit including center and periphery portions in a predetermined direction, and gives a larger optical loss to the periphery portion than that of the center portion. Also, $Do1<Do2$ and $Dn<Do2$ are satisfied, where $Do1$ is a width of an optical confinement region of the optical confinement layer in the predetermined direction, $Do2$ is a width of a current confinement region of the current confinement layer in the predetermined direction, and $Dn$ is a width of the center portion of the optical loss unit in the predetermined direction.

20 Claims, 18 Drawing Sheets

A-A CROSS SECTION

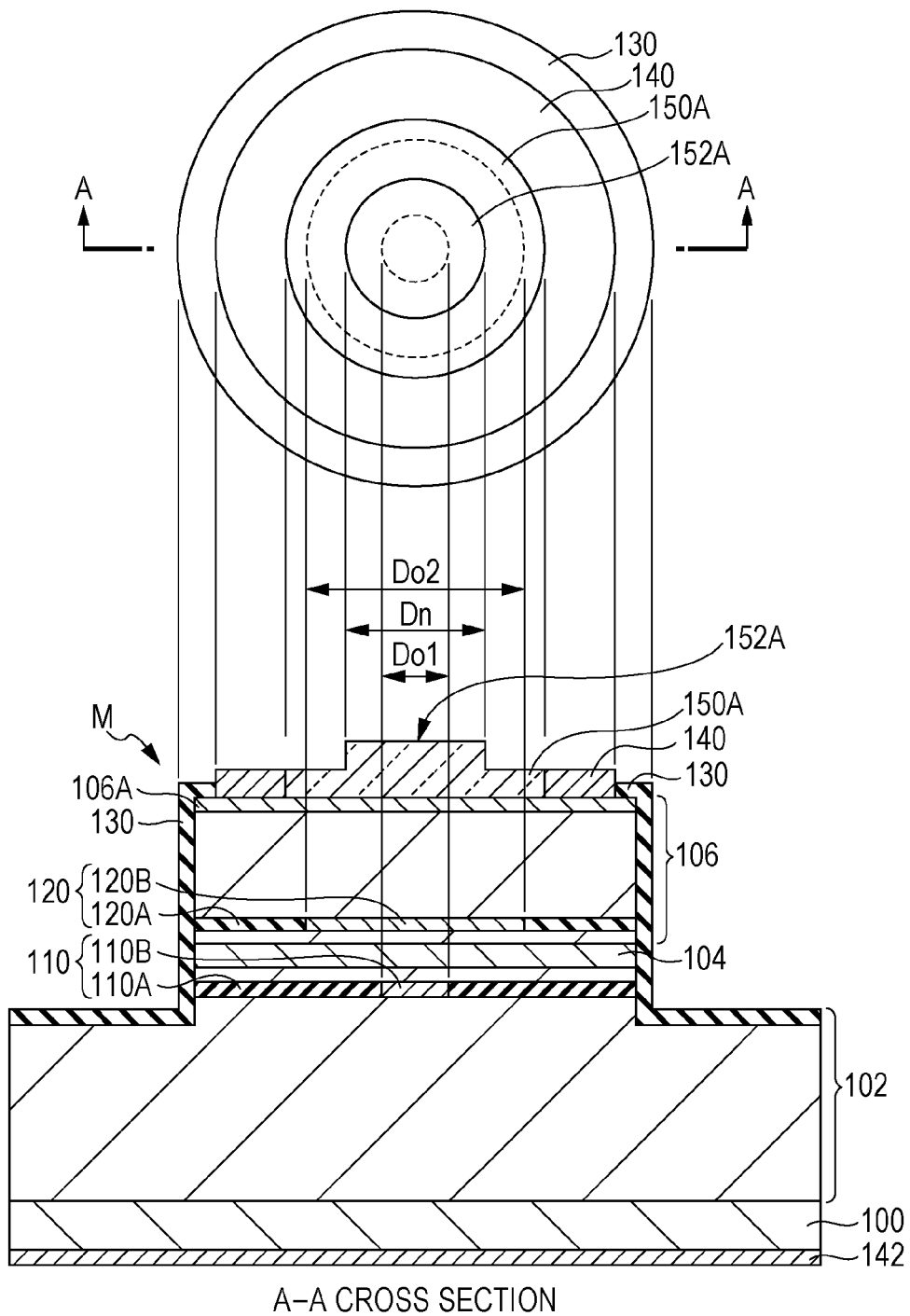

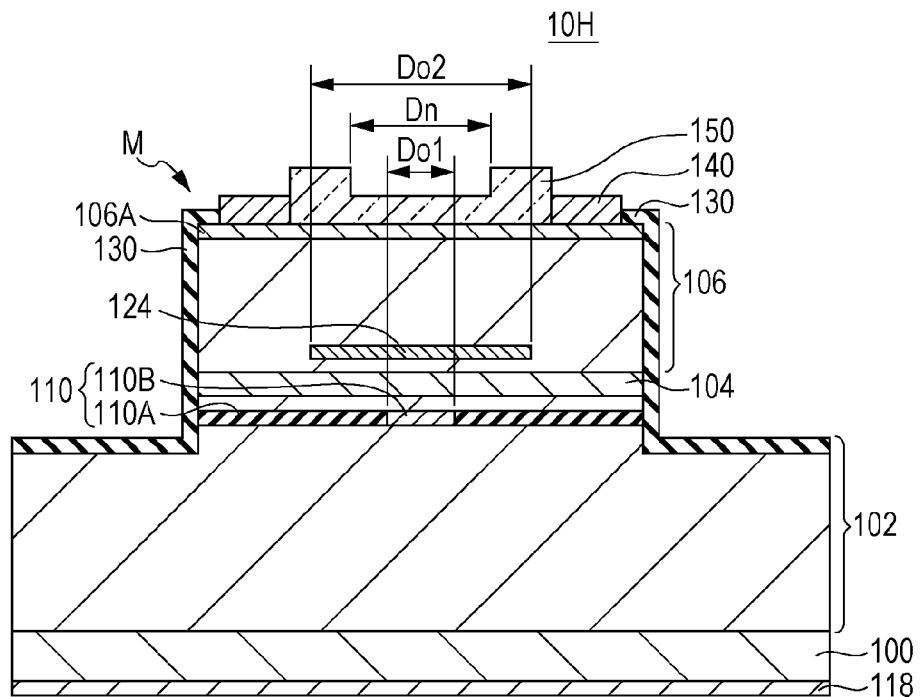
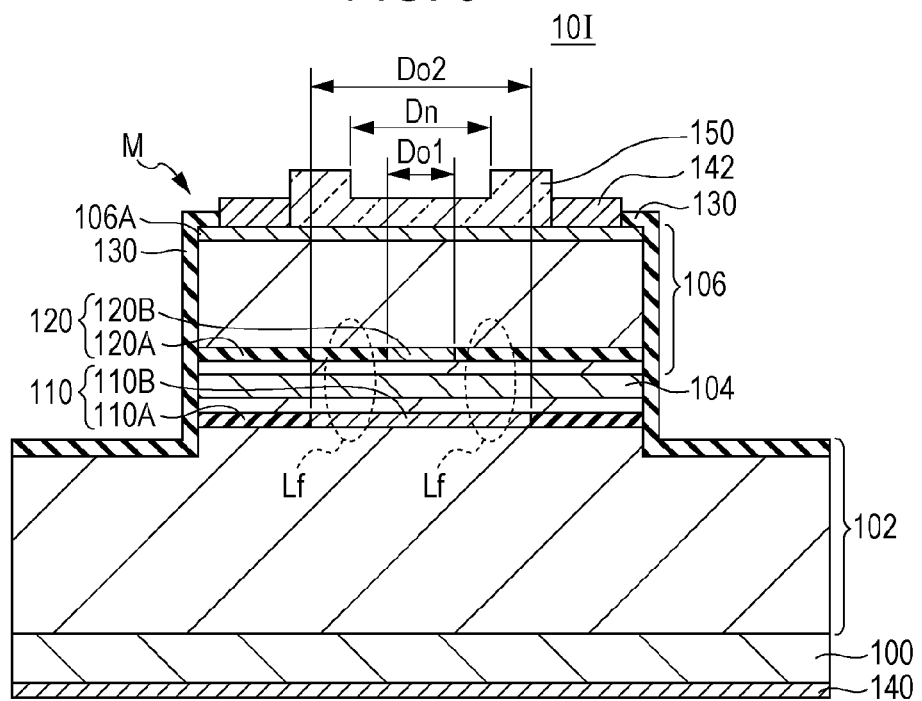

SURFACE EMITTING SEMICONDUCTOR LASER AND ITS MANUFACTURING METHOD, SURFACE EMITTING SEMICONDUCTOR LASER DEVICE, OPTICAL TRANSMITTER, AND INFORMATION PROCESSOR

CROSS-REFERENCE TO RELATED APPLICATIONS

This application is based on and claims priority under 35 USC 119 from Japanese Patent Application No. 2012-011724 filed Jan. 24, 2012.

BACKGROUND

The present invention relates to a surface emitting semiconductor laser and its manufacturing method, a surface emitting semiconductor laser device, an optical transmitter, and an information processor.

SUMMARY

According to an aspect of the invention, there is provided a surface emitting semiconductor laser including a substrate; a first semiconductor distributed bragg reflector of a first conductive type formed on the substrate; an active region formed on the first semiconductor distributed bragg reflector; a second semiconductor distributed bragg reflector of a second conductive type formed on the active region; a current confinement layer that confines current flowing in the active region; an optical confinement layer that confines light generated in the active region; and an optical loss unit that is provided in addition to the current confinement layer and the optical confinement layer, includes a center portion and a periphery portion in a predetermined direction, and gives a larger optical loss to the periphery portion than an optical loss given to the center portion. Also, $Do1<Do2$ and $Dn<Do2$ are satisfied, where $Do1$ is a width of an optical confinement region of the optical confinement layer in the predetermined direction, $Do2$ is a width of a current confinement region of the current confinement layer in the predetermined direction, and $Dn$ is a width of the center portion of the optical loss unit in the predetermined direction.

BRIEF DESCRIPTION OF THE DRAWINGS

Exemplary embodiments of the present invention will be described in detail based on the following figures, wherein:

FIG. 2 involves a schematic plan view of a surface emitting semiconductor laser according to a second exemplary embodiment of the present invention, and its cross section;

FIG. 8 is a schematic cross section of a surface emitting semiconductor laser according to a ninth exemplary embodiment of the present invention;

FIG. 9 is a schematic cross section of a surface emitting semiconductor laser according to a tenth exemplary embodiment of the present invention;

DETAILED DESCRIPTION

Exemplary embodiments of the present invention are described below with reference to the drawings. In the following description, a surface emitting semiconductor laser (vertical cavity surface emitting laser, VCSEL) is described as an example, and the surface emitting semiconductor laser is called VCSEL. The scales of the drawings are increased for easier understanding of features of the exemplary embodiments, and it is to be noted that the scales are not necessarily equivalent to the scales of an actual device.

Embodiments

Figure 1:
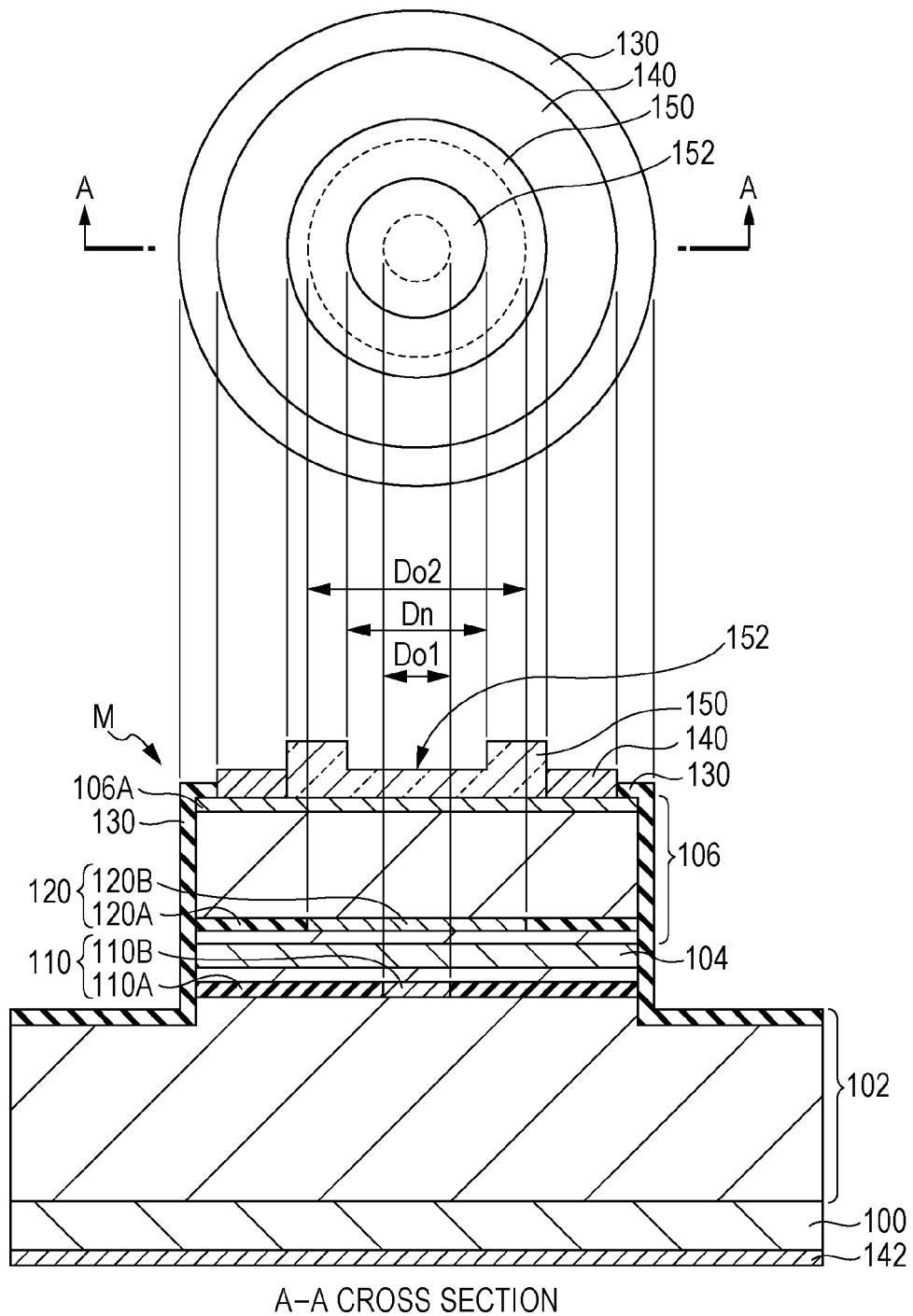
FIG. 1 involves a schematic plan view of a surface emitting semiconductor laser according to a first exemplary embodiment of the present invention, and its cross section.

FIG. 1 involves a schematic plan view of a selective oxidation VCSEL 10 according to a first exemplary embodiment of the present invention, and its cross section. As shown in the drawing, the VCSEL 10 according to this exemplary embodiment includes an n-type lower distributed bragg reflector, hereinafter, referred to as DBR) 102 formed on an n-type GaAs substrate 100 and having alternately stacked AlGaAs layers with different Al compositions as a high refractive index layer and a low refractive index layer, an active region 104 formed on the lower DBR 102 and having a quantum well layer arranged between upper and lower spacer layers, and a p-type upper DBR 106 formed on the active region 104 and having alternately stacked AlGaAs layers with different Al compositions.

The n-type lower DBR 102 is, for example, a multilayer stack including a pair of an $Al_{0.9}Ga_{0.1}As$ layer and an $Al_{0.3}Ga_{0.7}As$ layer. Each layer has a thickness of $\lambda/4\ n_r$ (where $\lambda$ is an oscillation wavelength, and $n_r$ is a refractive index of a medium). These layers are alternately stacked with 40 periods. The carrier density of the lower DBR 102 doped with silicon, which is an n-type impurity, is, for example, $3 \times 10^{18}$ cm$^{-3}$. The lower spacer layer of the active region 104 is, for example, an undoped $Al_{0.6}Ga_{0.4}As$ layer, the quantum well active layer is an undoped $Al_{0.11}Ga_{0.89}As$ quantum well layer and an undoped $Al_{0.3}Ga_{0.7}As$ barrier layer, and the upper spacer layer is an undoped $Al_{0.6}Ga_{0.4}As$ layer. The p-type upper DBR 106 is, for example, a multilayer stack including a pair of an $Al_{0.9}Ga_{0.1}As$ layer and an $Al_{0.3}Ga_{0.7}As$ layer. Each layer has a thickness of $\lambda/4\ n_r$. These layers are alternately stacked with 24 periods. The carrier density of the upper DBR 106 doped with carbon, which is a p-type impurity, is, for example, $3 \times 10^{18}$ cm$^{-3}$.

A first oxidation confinement layer 110 is formed at the uppermost layer of the lower DBR 102 or at a position close to the active region 104. The first oxidation confinement layer 110 includes an oxidation region 110A that is selectively oxidized and a conductive non-oxidation region 110B surrounded by the oxidation region 110A. The first oxidation confinement layer 110 is desirably formed of an n-type AlAs; however, the first oxidation confinement layer 110 may be formed of an AlGaAs with an Al composition increased to attain, for example, about 99%. The first oxidation confinement layer 110 confines light generated in the active region 104 within the non-oxidation region 110B with a higher refractive index than that of the oxidation region 110A and causes oscillation in a fundamental transverse mode. Of course, the first oxidation confinement layer 110 may also increase the density of electrons implanted to the active region 104.

A contact layer 106A is formed at the uppermost layer of the upper DBR 106. The contact layer 106A is formed of a GaAs with a high density of a p-type impurity. Also, a second oxidation confinement layer 120 is formed at the lowermost layer of the upper DBR 106 or at a position close to the active region 104. The second oxidation confinement layer 120 is formed of a p-type AlAs. The second oxidation confinement layer 120 includes an oxidation region 120A that is selectively oxidized and a conductive non-oxidation region 120B surrounded by the oxidation region 120A. The second oxidation confinement layer 120 is desirably formed of a p-type AlAs; however, the second oxidation confinement layer 120 may be formed of an AlGaAs with an Al composition increased to attain, for example, about 99%. The second oxidation confinement layer 120 confines carriers (positive holes) so that the implantation density of the carriers implanted to the active region 104 is increased. Of course, since the non-oxidation region 120B of the second oxidation confinement layer 120 has a higher refractive index than that of the oxidation region 120A, the non-oxidation region 120B may have an optical confinement function.

By etching semiconductor layers from the upper DBR 106 to the lower DBR 102, a cylindrical mesa (a columnar or substantially columnar structure) M is formed on the substrate 100. Etching for the mesa M may be performed by a depth that allows at lease the first oxidation confinement layer 110 to be exposed from a side surface. The first and second oxidation confinement layers 110 and 120 are exposed from the side surface of the mesa M, and hence the oxidation regions 110A and 120A that are selectively oxidized from the side surface are formed. In an oxidation step, the oxidation rate of an AlAs layer is higher than the oxidation rate of an AlGaAs layer, and the oxidation progresses at a substantially constant speed from the side surface of the mesa M to the inside. Hence, the planar shapes of the non-oxidation regions 110B and 120B in planes parallel to the principal plane of the substrate 100 are circular shapes that reflect the outside shape of the mesa M, and the centers are aligned with the center of the axial direction of the mesa M, i.e., the optical axis.

In this exemplary embodiment, as shown in FIG. 1, a diameter Do1 of the non-oxidation region 110B of the first oxidation confinement layer 110 is smaller than a diameter Do2 of the non-oxidation region 120B of the second oxidation confinement layer 120. The first oxidation confinement layer 110 confines light so that light in a fundamental transverse mode is generated. The diameter Do1 is, for example, about 3 μm in a wavelength range of 780 nm. The second oxidation confinement layer 120 confines current that is implanted to the active region 104. The diameter Do2 is, for example, 7 μm. The first and second oxidation confinement layers 110 and 120 are desirably simultaneously oxidized; however, the oxidation rates depend on the film thicknesses or the Al compositions. For example, the larger the film thickness of an AlAs, the higher the oxidation rate. Hence, the film thickness of the first oxidation confinement layer 110 is formed to be larger than the film thickness of the second oxidation confinement layer 120. It is to be noted that the first oxidation confinement layer 110 desirably has a film thickness that does not noticeably affect the reflectivity of the lower DBR 102 and the reflectivity of the upper DBR 106. For example, the first oxidation confinement layer 110 is an AlAs with a film thickness of about 30 μm, and the second oxidation confinement layer 120 is an AlAs with a film thickness of about 20 μm. Alternatively, the Al composition of the first oxidation confinement layer 110 may be increased as compared with the Al composition of the second oxidation confinement layer 120, so that a difference is generated between the oxidation rates of the first and second oxidation confinement layers 110 and 120.

As described above, since the first oxidation confinement layer 110 confines light and the second oxidation confinement layer 120 confines current, the non-oxidation region 120B of the second oxidation confinement layer 120 may have a relatively large area. Also, the diameter Do1 of the first oxidation confinement layer 110 may be optimized. Accordingly, the resistance of an element is decreased and the output of the element is increased.

Also, an interlayer insulating film 130 is formed to surround the bottom, side, and the peripheral edge of the top of the mesa M. The interlayer insulating film 130 is formed of, for example, silicon nitride (SiN). A ring-shaped or substantially ring-shaped p-side electrode 140 made of metal is formed at the top of the mesa M exposed from the interlayer insulating film 130. The p-side electrode 140 is formed of metal by stacking, for example, Au or Ti/Au. The p-side electrode 140 is connected with the contact layer 106A of the upper DBR 106 by ohmic contact. A circular opening that defines a light emitting opening is formed at the center of the p-side electrode 140. The center of the light emitting opening is desirably aligned with the optical axis of the mesa M. In other words, the center of the light emitting opening is substantially aligned with the centers of the non-oxidation regions 110B and 120B. An n-side electrode 142 is formed at the back surface of the substrate 100. The n-side electrode 142 is electrically connected with the lower DBR 102.

A reflectivity adjustment member 150 is formed at the top of the mesa M to cover the light emitting opening of the p-side electrode 140. The reflectivity adjustment member 150 is made of a material that transmits light with an oscillation wavelength. The reflectivity adjustment member 150 causes an optical loss of a periphery portion to be larger than that of a center portion 152 near the optical axis of the light emitting opening. The reflectivity adjustment member 150 desirably has a function of decreasing the reflectivity of the periphery portion as compared with the reflectivity of the center portion 152. Although described later, the center portion 152 is a region with a smaller film thickness than that of the periphery portion, and is defined by a diameter Dn. The reflectivity adjustment member 150 restricts oscillation in a high-order higher mode by decreasing the reflectivity of the periphery portion of the upper DBR 106.

The reflectivity adjustment member 150 uses, as a material that transmits light with the oscillation wavelength, SiN, SiON, or $SiO_2$. The refractive index and film thickness of the reflectivity adjustment member 150 are selected so that the reflectivity of the center portion of the upper DBR 106 near the optical axis becomes high and the reflectivity of the periphery portion becomes low. The film thickness of the center portion is desirably $\lambda \times x/2n_1$, and the film thickness of the periphery portion is desirably $\lambda \times (y+\frac{1}{2})/2n_1$. Herein $\lambda$ is an oscillation wavelength, x and y are natural numbers (including 0), and $n_1$ is a refractive index of the reflectivity adjustment material. For example, the reflectivity of the center portion of the upper DBR 106 is 99.5%, the reflectivity of the periphery portion is 98.0%, and the difference in reflectivity is 1.5%. If the reflectivity of the upper DBR 106 becomes 99% or lower, laser oscillation becomes difficult.

When the mesa M is cylindrical, the light emitting opening of the p-side electrode 140 is also desirably formed in a circular shape. The center portion of the reflectivity adjustment member 150 is also formed in a circular shape correspondingly. The diameter Dn of the center portion 152 of the reflectivity adjustment member 150 is between the diameters Do1 and Do2 of the non-oxidation regions 110B and 120B of the first and second oxidation confinement layers 110 and 120. Hence, Do1<Dn, Dn<Do2 are established.

Alternatively, relationships of Do1<Do2 and Dn<Do2 are established. For example, when Do1 is 5 μm, Dn=6 to 8 μm, and Do2>9 μm. When Do1 is 3 μm, Dn=4 to 6 μm, and Do2>7 μm. The optimal value of the diameter Do1 varies depending on the film thickness, structure, and position in DBR of the oxidation confinement layer, as well as the oscillation wavelength. Therefore, the optimal value of the diameter Do1 is not always uniquely determined. Also, the above-described relationship may be Do1 Dn<Do2.

With the VCSEL 10 according to this exemplary embodiment, oscillation in a high-order higher mode, which may be generated at a position in a radial direction corresponding to a larger diameter than the diameter Do1 of the non-oxidation region 110B, is restricted at the periphery portion of the reflectivity adjustment member 150. In contrast, oscillation in a fundamental transverse mode for light confined within the non-oxidation region 110B is promoted at the center portion of the reflectivity adjustment member 150.

Figure 14A:
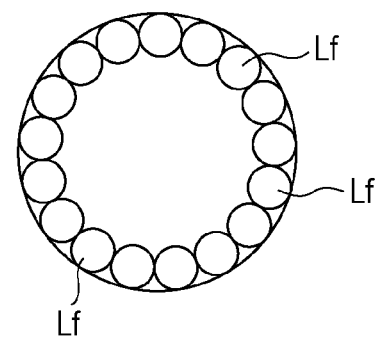
FIGS. 14A and 14B are illustrations explaining oscillation in a higher mode of a surface emitting semiconductor laser having a two-layer selective oxidation structure without a reflectivity adjustment member.
Figure 14B:
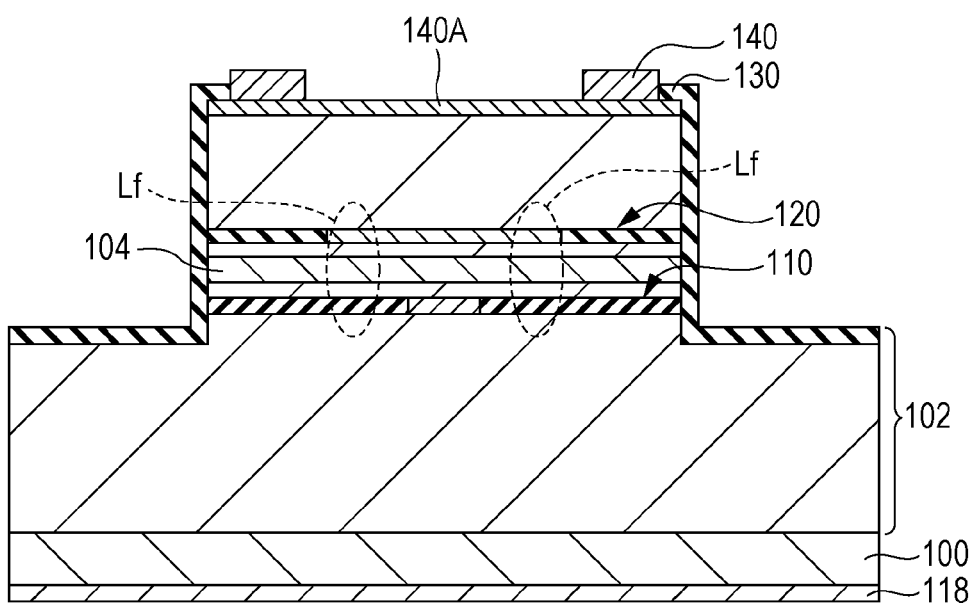

FIGS. 14A and 14B illustrate an example of a VCSEL having a two-layer oxidation structure without a reflectivity adjustment member. The VCSEL includes the first and second oxidation confinement layers 110 and 120, the diameter Do1 of the non-oxidation region 110B of the first oxidation confinement layer 110 has a size for causing oscillation in a single transverse mode, and the diameter Do2 of the non-oxidation region 120B of the second oxidation confinement layer 120 is larger than the diameter Do1 (Do1<Do2). However, the VCSEL does not include the reflectivity adjustment member 150 unlike this exemplary embodiment. In such a VCSEL, as shown in FIG. 14B, it is found that oscillation conditions are satisfied if the reflectivity of a vertical oscillator is 99% or higher and carriers are present at a position near the outer edge corresponding to a larger diameter than the diameter Do1 of the non-oxidation region 110B, and high-order higher mode oscillation Lf which is not affected by the diameter Do1 of the non-oxidation region 110B is generated with priority. That is, a low-order higher mode of a fundamental transverse mode is effectively restricted by the diameter Do1 of the non-oxidation region 110B; however, the high-order higher mode satisfies the oscillation conditions and oscillation is generated. FIG. 14A schematically shows a near field pattern when viewed from the upper side. In contrast, in the VCSEL 10 according to this exemplary embodiment shown in FIG. 1, since the reflectivity of the periphery portion of the reflectivity adjustment member 150 is 99% or lower, the oscillation conditions are not satisfied. As the result, the higher mode oscillation Lf is restricted near the outer edge of the diameter Do1 of the non-oxidation region 101B. Also, the oscillation in the fundamental transverse mode of light confined by the diameter Do1 of the non-oxidation region 101B is promoted due to the high reflectivity of the center portion 152 of the reflectivity adjustment member 150.

Also, with a VCSEL not having a two-layer oxidation structure but having a reflectivity modulation structure in which the reflectivity of the center portion is higher than the reflectivity of the periphery portion and hence the oscillation in the single transverse mode is available, the difference in reflectivity is not increased. Oscillation in a low-order higher mode (a higher mode next to the fundamental mode) is generated with a high current value. This is not suitable for the increase in output. Further, a step is present in the region where the fundamental mode is present. Hence, a loss is generated due to variation in process etc., resulting in that the current becomes current with a high threshold, and variation in optical output appears. In contrast, with the VCSEL according to this exemplary embodiment, the oscillation in the low-order higher mode of the fundamental transverse mode is restricted by the oxidation confinement layer which is one of the two-layer oxidation structure. Also, current is confined by the relatively large oxidation diameter of the other oxidation confinement layer, and hence the current becomes current with a low threshold. Further, the step by the reflectivity adjustment member restricts the oscillation in the high-order higher mode separated from the fundamental transverse mode. A large loss is prevented from being given to the fundamental transverse mode.

In the above-described exemplary embodiment, the mesa M is formed in the cylindrical shape, and the non-oxidation regions 110B and 120B, the light emitting opening of the p-side electrode 140, and the center portion 152 of the reflectivity adjustment member 150 are formed in the circular shapes. However, these shapes are mere examples, and may be other shapes. For example, if the center portion 152 of the reflectivity adjustment member 150 has an elliptic shape, the width of part of the elliptic shape in the longitudinal direction may be larger than the width Do2 of the non-oxidation region 120B. As long as the width of the center portion 152 of the elliptic shape in a predetermined direction is smaller than the width Do2 of the non-oxidation region, the elliptic shape may pertain to the technical scope of the exemplary embodiment of the present invention. Similarly, if the non-oxidation region 110B has a shape other than the circular shape, for example, an elliptic shape, the width of part of the non-oxidation region 110B in the longitudinal direction may be larger than the width of the center portion 152 of the reflectivity adjustment member 150. As long as the width of the non-oxidation region 110B in the predetermined direction is smaller than the width of the center portion 152, the elliptic shape may pertain to the technical scope of the exemplary embodiment of the present invention. Further, if the mesa M performs polarization control by having anisotropy in X and Y directions, the mesa M may be formed in an elliptic shape, and the non-oxidation regions 110B and 120B of the first and second oxidation confinement layers 110 and 120 may have elliptic shapes. Also, the light emitting opening of the p-side electrode 140 may have an elliptic shape or other anisotropic shape so that anisotropy is generated in the X and Y directions.

Therefore, according to the exemplary embodiment of the present invention, only required is that the width Dn in the predetermined direction of the center portion of the reflectivity adjustment member 150, the width Do1 in the predetermined direction of the non-oxidation region 110B of the confinement layer for confining light, and the width Do2 in the predetermined direction of the non-oxidation region 120B of the confinement layer for confining current satisfy the relationships of Do1<Do2 and Dn<Do2, or the relationship of Do1≤Dn<Do2.

FIG. 2 involves a schematic plan view of a VCSEL 10A according to a second exemplary embodiment of the present invention, and its cross section. In the drawing, the same reference signs are applied to the same components as those of the first exemplary embodiment. In a reflectivity adjustment member 150A according to the second exemplary embodiment, the reflectivity of a center portion 152A at the light emitting opening is high and the reflectivity of a periphery portion is low. Unlike the first exemplary embodiment, in the reflectivity adjustment member 150A, the film thickness of the center portion 152A is larger than the film thickness of the periphery portion.

The reflectivity adjustment member 150A desirably uses a dielectric film of SiN, SiON, SiO$_2$, or the like, as a material transmitting light with the oscillation wavelength. The film thickness of the reflectivity adjustment member 150A is $\lambda \times x/2n_1$, and the film thickness of the periphery portion is $\lambda \times (y+\frac{1}{2})/2n_1$. Herein $\lambda$ is an oscillation wavelength, x and y are natural numbers (including 0), and $n_1$ is a refractive index of the reflectivity adjustment material. When the refractive index and film thickness of the reflectivity adjustment member 150A are appropriately adjusted, for example, the reflec- tivity of the center portion of the upper DBR 106 is 99.6%, the reflectivity of the periphery portion is 98.7%, and the difference in reflectivity is 0.9%.

Next, other configuration examples of the reflectivity adjustment member according to any of the exemplary embodiments are described with reference to FIGS. 3A to 3H. In any of the first and second exemplary embodiments, the reflectivity adjustment member 150, 150A is formed by changing the film thickness of the single material. However, the reflectivity adjustment member may be formed of plural materials. Reflectivity adjustment members 150 in FIGS. 3A and 3B are modifications of the first exemplary embodiment, in which the film thickness of the center portion is smaller than the film thickness of the periphery portion.

Figure 3A:
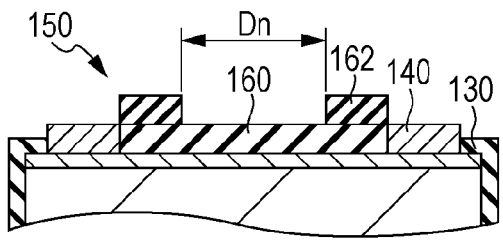
FIGS. 3A to 3H illustrate examples of a reflectivity modulation structure applicable to the surface emitting semiconductor laser according to the exemplary embodiments of the present invention.

In FIG. 3A, the reflectivity adjustment member 150 includes a first reflectivity adjustment material 160 and a second reflectivity adjustment material 162. The first reflectivity adjustment material 160 covers the entire plane of the circular light emitting opening of the p-side electrode 140, and the ring-shaped second reflectivity adjustment material 162 is stacked so that the center portion of the reflectivity adjustment material 160 is exposed. The region exposed from the second reflectivity adjustment material 162 defines the center portion 152. By appropriately selecting the materials and film thicknesses of the first reflectivity adjustment material 160 and the second reflectivity adjustment material 162, the reflectivity of the center portion is increased, and the reflectivity of the periphery portion is decreased. In this case, the reflectivity of the periphery portion is desirably 99% or lower. The first reflectivity adjustment material 160 desirably has a smaller refractive index than the refractive index of the semiconductor layer of the upper DBR 106, and has a film thickness that is odd-number times $\frac{1}{2}$ of the oscillation wavelength. For example, a material of SiON, SiO$_2$, SiN, or TiO$_2$ is used. The second reflectivity adjustment material 162 has a larger refractive index than the refractive index of the first reflectivity adjustment material 160, and has a film thickness that is odd-number times $\frac{1}{4}$ of the oscillation wavelength. For example, a material of SiON, SiO$_2$, SiN, or TiO$_2$ is used. When the first reflectivity adjustment material 160 is SiON (refractive index=1.57) with a film thickness of $\lambda/2$ and the second reflectivity adjustment material 162 is SiN (refractive index=1.92) with a film thickness of $\lambda/4$, the reflectivity of the center portion of the upper DBR is 99.7%, the reflectivity of the periphery portion is 98.8%, and the difference in reflectivity is 0.9%.

Figure 3B:
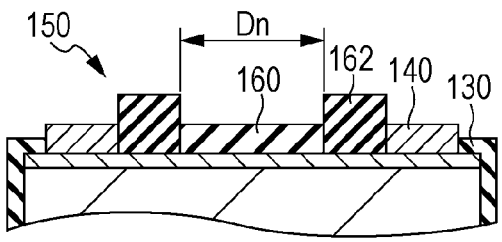

In FIG. 3B, a first reflectivity adjustment material 160 defined by the diameter Dn is formed on the light emitting opening, and a ring-shaped second reflectivity adjustment material 162 is formed around the first reflectivity adjustment material 160. Even in this case, by appropriately selecting the refractive index and film thickness of the first reflectivity adjustment material 160 and the refractive index and film thickness of the second reflectivity adjustment material 162, the reflectivity of the center portion becomes higher than the reflectivity of the periphery portion.

Figure 3C:
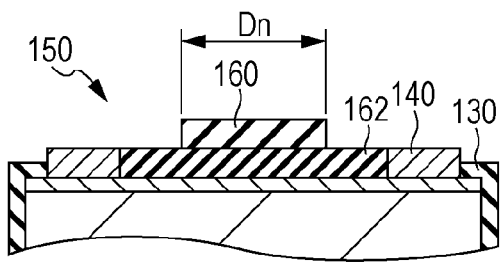
Figure 3D:
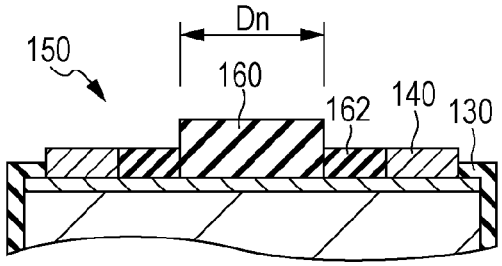

FIGS. 3C and 3D are modifications of the second exemplary embodiment, in which the film thickness of the center portion is larger than the film thickness of the periphery portion. In FIG. 3C, a reflectivity adjustment member 150 is formed of a first reflectivity adjustment material 160 and a second reflectivity adjustment material 162, the first reflectivity adjustment material 160 is formed to cover the circular light emitting opening of the p-side electrode 140, and the circular second reflectivity adjustment material 162 defined by the diameter Dn is formed on the first reflectivity adjustment material 160. The first reflectivity adjustment material 160 and the second reflectivity adjustment material 162 desirably have film thickness that are odd-number times λ/4 of the oscillation wavelength. The refractive index of the second reflectivity adjustment material is higher than the refractive index of the first reflectivity adjustment material, and the refractive index of a contact layer of the upper DBR 106 is higher than the refractive index of the second reflectivity adjustment material. For example, when the first reflectivity adjustment material 160 is SiON with a film thickness of λ/4 and the second reflectivity adjustment material 162 is SiN with a film thickness of λ/4, the reflectivity of the center portion of the upper DBR is 99.7%, the reflectivity of the periphery portion is 99.2%, and the difference in reflectivity is 0.5%.

In FIG. 3D, a first reflectivity adjustment material 160 defined by the diameter Dn is formed on the light emitting opening, and a ring-shaped second reflectivity adjustment material 162 is formed around the first reflectivity adjustment material 160. Even in this case, by appropriately selecting the refractive index and film thickness of the first reflectivity adjustment material 160 and the refractive index and film thickness of the second reflectivity adjustment material 162, the reflectivity of the center portion becomes higher than the reflectivity of the periphery portion.

Figure 3E:
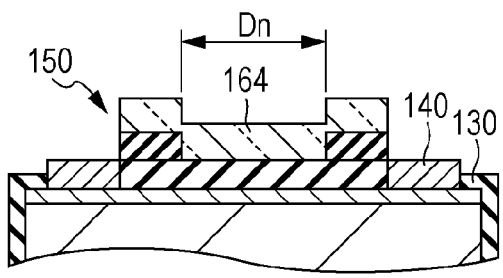
Figure 3F:
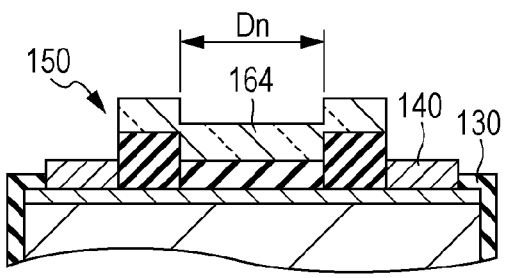
Figure 3G:
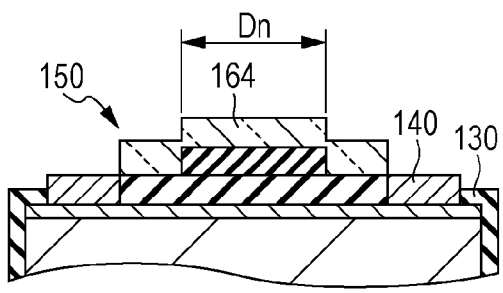
Figure 3H:
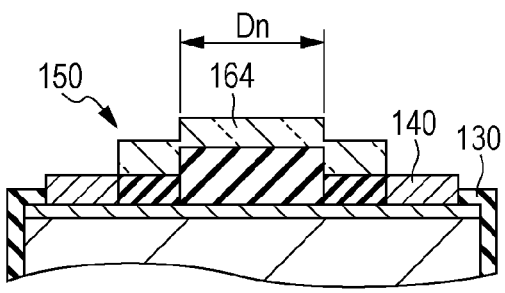

FIGS. 3E to 3H show examples when a reflectivity adjustment member 150 has a three-layer structure. In FIG. 3E, a third reflectivity adjustment material 164 is stacked on the configuration in FIG. 3A. In FIG. 3F, the third reflectivity adjustment material 164 is stacked on the configuration in FIG. 3B. In FIG. 3G, the third reflectivity adjustment material 164 is stacked on the configuration in FIG. 3C. In FIG. 3H, the third reflectivity adjustment material 164 is stacked on the configuration in FIG. 3D. The third reflectivity adjustment material 164 is formed of a material transmissive for light with the oscillation wavelength. The third reflectivity adjustment material 164 may be the same as the first and second reflectivity adjustment material 160 and 162, or may be different from these materials. By appropriately selecting the refractive index and film thickness of the third reflectivity adjustment material 164, the reflectivity of the center portion may be higher than the reflectivity of the periphery portion.

Figure 4A:
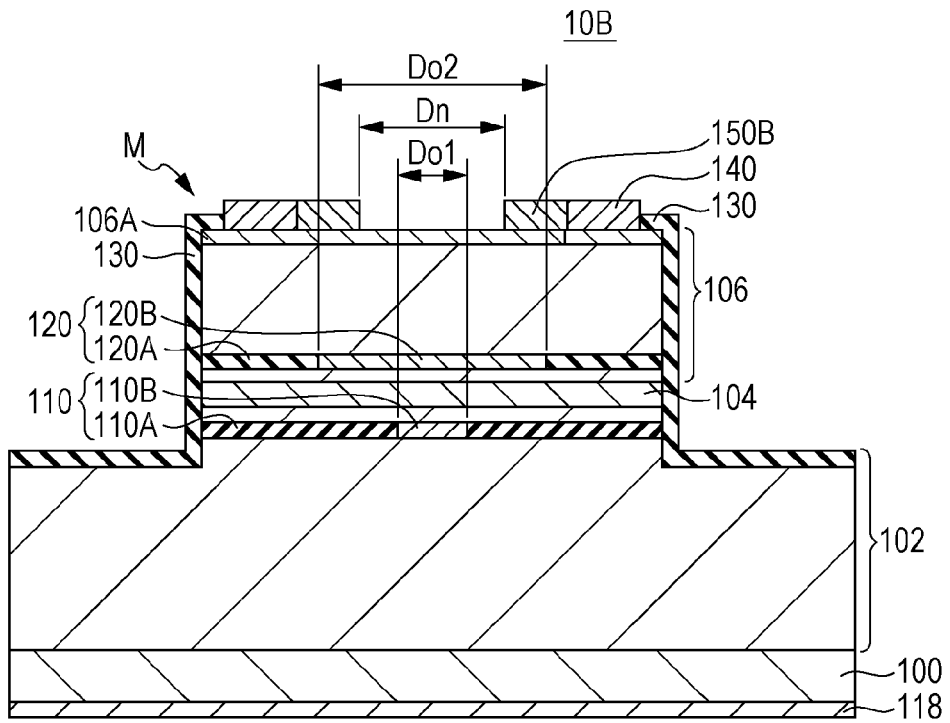
FIG. 4A is a schematic cross section of a surface emitting semiconductor laser according to a third exemplary embodiment of the present invention.

FIG. 4A illustrates a VCSEL 10B according to a third exemplary embodiment of the present invention. In the VCSEL 10B according to the third exemplary embodiment, a reflectivity adjustment member 150B is formed of a ring-shaped dielectric film with the inner diameter Dn. The refractive index and film thickness of the reflectivity adjustment member 150B are selected so that the reflectivity of the periphery portion covered with the reflectivity adjustment member 150B is lower than the reflectivity of the exposed center portion.

Figure 4B:
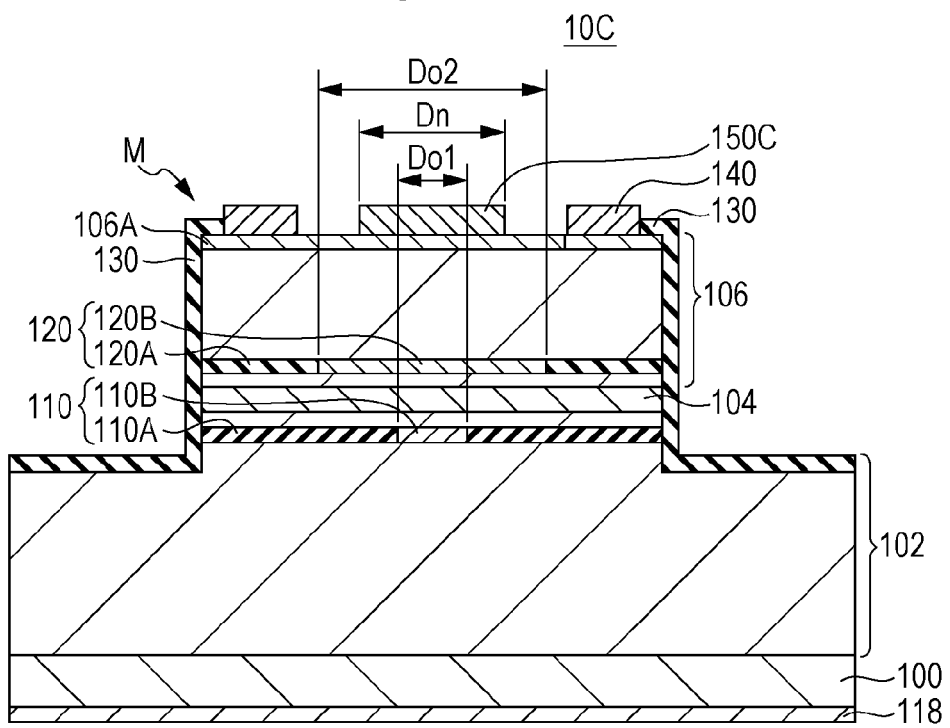
FIG. 4B is a schematic cross section of a surface emitting semiconductor laser according to a fourth exemplary embodiment of the present invention.

FIG. 4B illustrates a VCSEL 10C according to a fourth exemplary embodiment of the present invention. In the VCSEL 10C according to the fourth exemplary embodiment, a reflectivity adjustment member 150C is formed of a circular dielectric film with the diameter Dn. The refractive index and film thickness of the reflectivity adjustment member 150C are selected so that the reflectivity of the center portion covered with the reflectivity adjustment member 150C is higher than the reflectivity of the periphery portion exposed from the reflectivity adjustment member 150C.

Figure 5A:
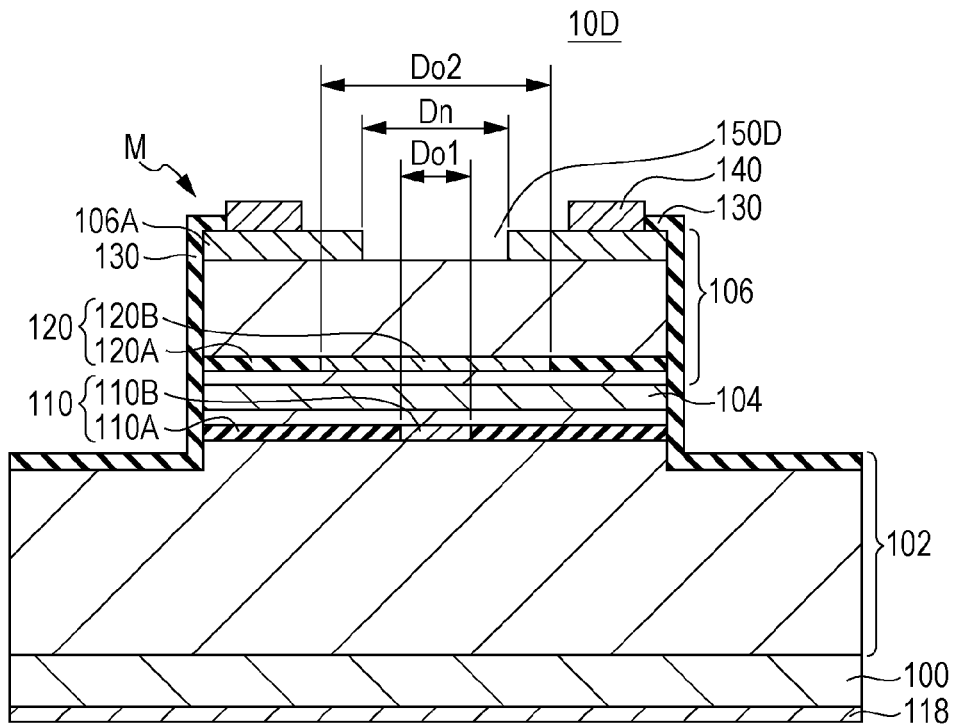
FIG. 5A is a schematic cross section of a surface emitting semiconductor laser according to a fifth exemplary embodiment of the present invention.

FIG. 5A illustrates a VCSEL 10D according to a fifth exemplary embodiment of the present invention. In the VCSEL 10D according to the fifth exemplary embodiment, a reflectivity adjustment member 150D has a groove formed at the center portion of the semiconductor layer of the mesa M. A circular groove with the diameter Dn is desirably formed by etching the center portion of the contact layer 106A, and the film thickness of the contact layer 106A is selected so that the reflectivity of the center portion with the contact layer 106A removed is higher than the reflectivity of the periphery portion with the contact layer 106A remaining.

Figure 5B:
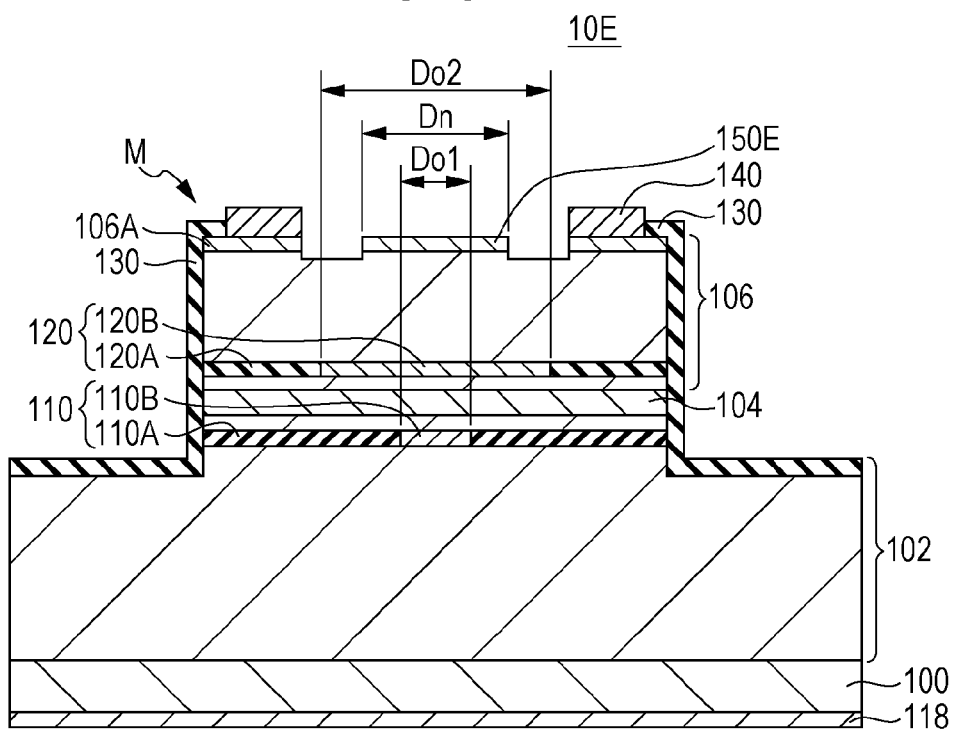
FIG. 5B is a schematic cross section of a surface emitting semiconductor laser according to a sixth exemplary embodiment of the present invention.

FIG. 5B illustrates a VCSEL 10E according to a sixth exemplary embodiment of the present invention. In the VCSEL 10E according to the sixth exemplary embodiment, a reflectivity adjustment member 150E has a groove formed at the periphery portion of the semiconductor layer of the mesa M. A ring-shaped groove is desirably formed by etching the periphery portion of the contact layer 106A, and a circular pattern with the diameter Dn remains at the center portion. The film thickness and the depth of the groove of the contact layer 106A are selected so that the reflectivity of the center portion is higher than the reflectivity of the periphery portion.

Figure 6:
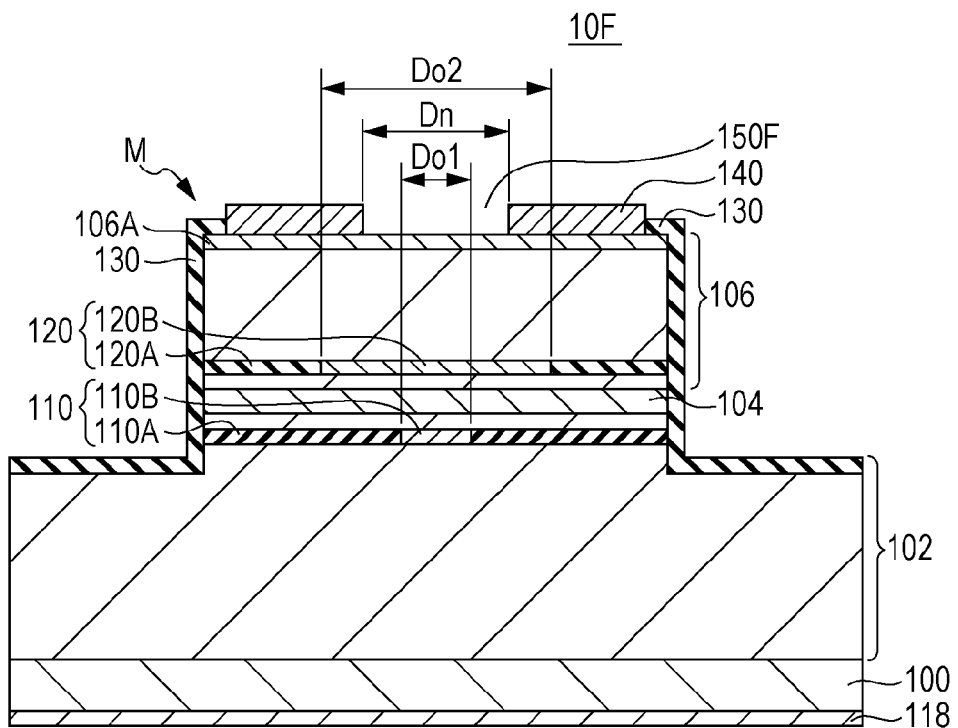
FIG. 6 is a schematic cross section of a surface emitting semiconductor laser according to a seventh exemplary embodiment of the present invention.

FIG. 6 illustrates a VCSEL 10F according to a seventh exemplary embodiment of the present invention. In the VCSEL 10F according to the seventh exemplary embodiment, a reflectivity adjustment member 150F is formed by using a metal material. The p-side electrode 140 is desirably patterned so that the light emitting opening with the diameter Dn is formed. Accordingly, the reflectivity of the periphery portion covered with the p-side electrode 140 is smaller than the reflectivity of the center portion with the diameter Dn exposed from the p-side electrode 140. In the above-described exemplary embodiment, the reflectivity adjustment member 150F is formed by the p-side electrode 140; however, the reflectivity adjustment member 150F may be formed by using metal different from the p-side electrode.

Figure 7:
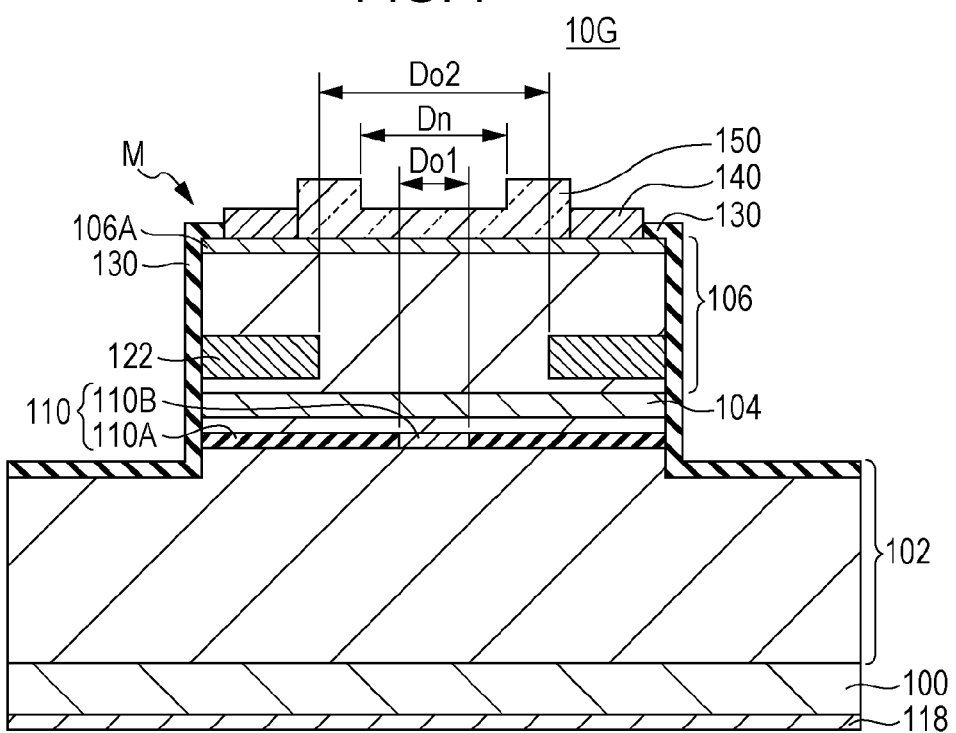
FIG. 7 is a schematic cross section of a surface emitting semiconductor laser according to an eighth exemplary embodiment of the present invention.

FIG. 7 illustrates a VCSEL 10G according to an eighth exemplary embodiment of the present invention. In the VCSEL 10G according to the eighth exemplary embodiment, a high-resistance region 122 is formed by ion implanting in the upper DBR 106 instead of the second oxidation confinement layer 120 provided in the first exemplary embodiment. By implanting protons by a constant energy, the ring-shaped high-resistance region 122 is desirably formed at a predetermined depth in the upper DBR 106. The high-resistance region forms the conductive region with the diameter Do2.

FIG. 8 illustrates a VCSEL 10H according to a ninth exemplary embodiment of the present invention. In the VCSEL 10H according to the ninth exemplary embodiment, a tunnel junction region 124 is formed in the upper DBR 106 instead of the second oxidation confinement layer 120 provided in the first exemplary embodiment. The tunnel junction region 124 is desirably defined by the diameter Do2 and includes a p-type semiconductor layer with a high p-type impurity density, and an n-type semiconductor layer with a high n-type impurity density. When the VCSEL 10H is forward biased, the p-type semiconductor layer and the n-type semiconductor layer are reverse biased, and tunnel current is implanted to the active region 104.

FIG. 9 illustrates a VCSEL 10I according to a tenth exemplary embodiment of the present invention. The VCSEL 10I according to the tenth exemplary embodiment uses a p-type GaAs substrate, the lower DBR 102 is p-type, and the upper DBR 106 is n-type. The n-side electrode 142 is formed at the top of the mesa M, and the p-side electrode 140 is formed at the back surface of the substrate. The first oxidation confinement layer 110 formed at the lower DBR 102 includes the oxidation region 110A and the non-oxidation region 110B with the diameter Do2. The second oxidation confinement layer 120 formed at the upper DBR 106 includes the oxidation region 110A and the non-oxidation region 120B with the diameter Do1.

Figure 10:
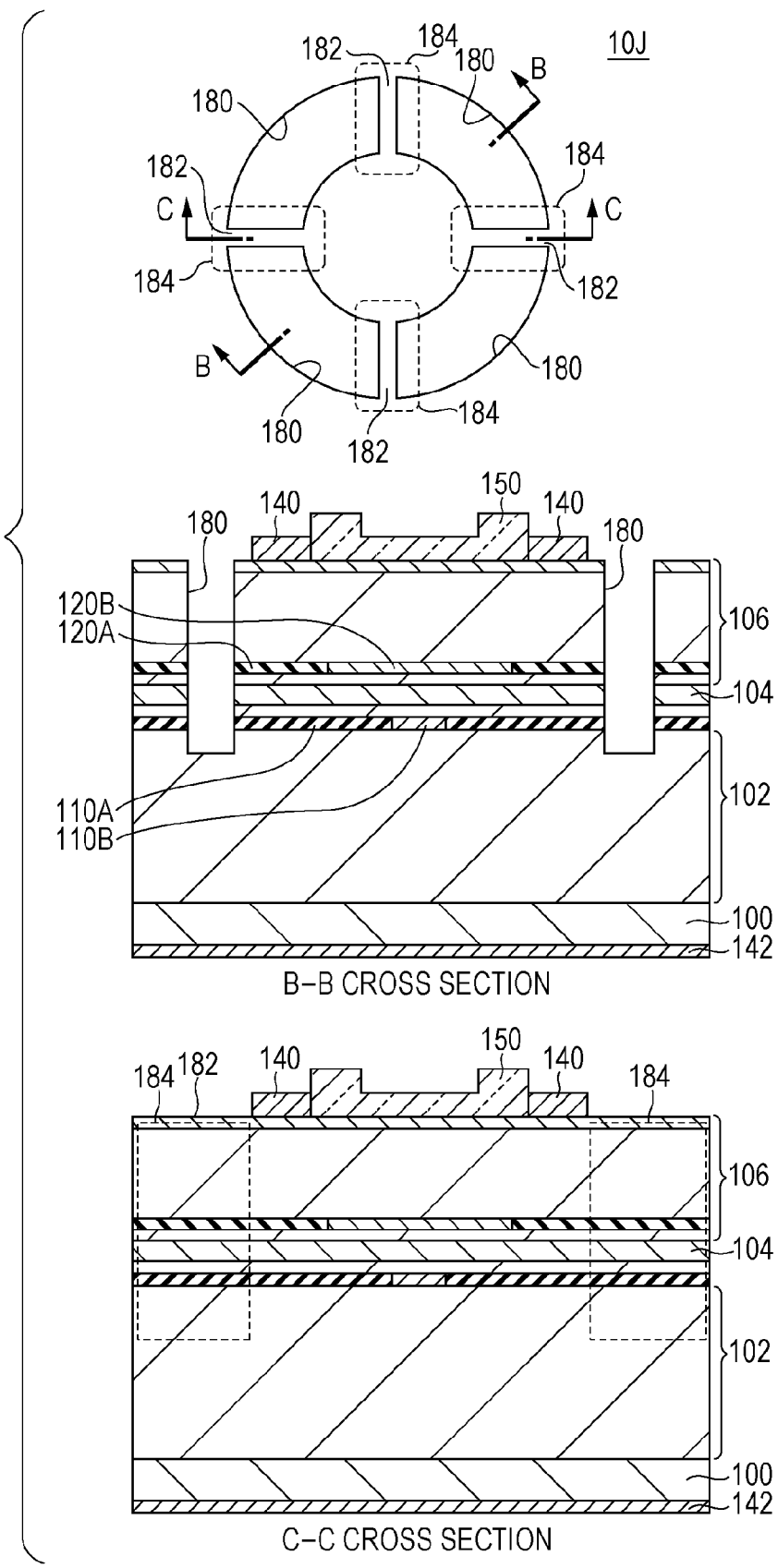
FIG. 10 involves a schematic plan view of a surface emitting semiconductor laser according to an eleventh exemplary embodiment of the present invention, and its cross sections.

FIG. 10 illustrates a VCSEL 10J according to an eleventh exemplary embodiment of the present invention. The VCSEL 10J according to the eleventh exemplary embodiment differs from the mesa type of the first exemplary embodiment, and is a hole (trench) type. Plural holes 180, for example, four holes 180 are desirably formed by etching the upper DBR 106 and the lower DBR 102. The plan shape of each hole 180 is a sector shape with an angle of about 90 degrees. Thin coupling portions 182 are formed between the holes. The first and second oxidation confinement layers 110 and 120 are oxidized from a side exposed to the holes 180. Similarly to the first exemplary embodiment, the non-oxidation region 110B with the diameter Do1 and the non-oxidation region 120B with the diameter Do2 are formed. In this oxidation step, the p-type AlAs and n-type AlAs in the coupling portions 182 are also simultaneously oxidized. To restrict leakage of current through the coupling portions 182, the resistance of part of the upper DBR 106 and part of the lower DBR 102 at the coupling portions 182 may be increased by proton ion implanting. In this case, by adjusting the implantation energy and dose quantity, the resistance of a desirable area of the coupling portions 182 (for example, areas indicated by broken lines in the drawing) may be increased. Even in the eleventh exemplary embodiment, the second oxidation confinement layer may be replaced with the high-resistance region by ion implanting (the eighth exemplary embodiment) or the tunnel junction region (the ninth exemplary embodiment).

Figure 11:
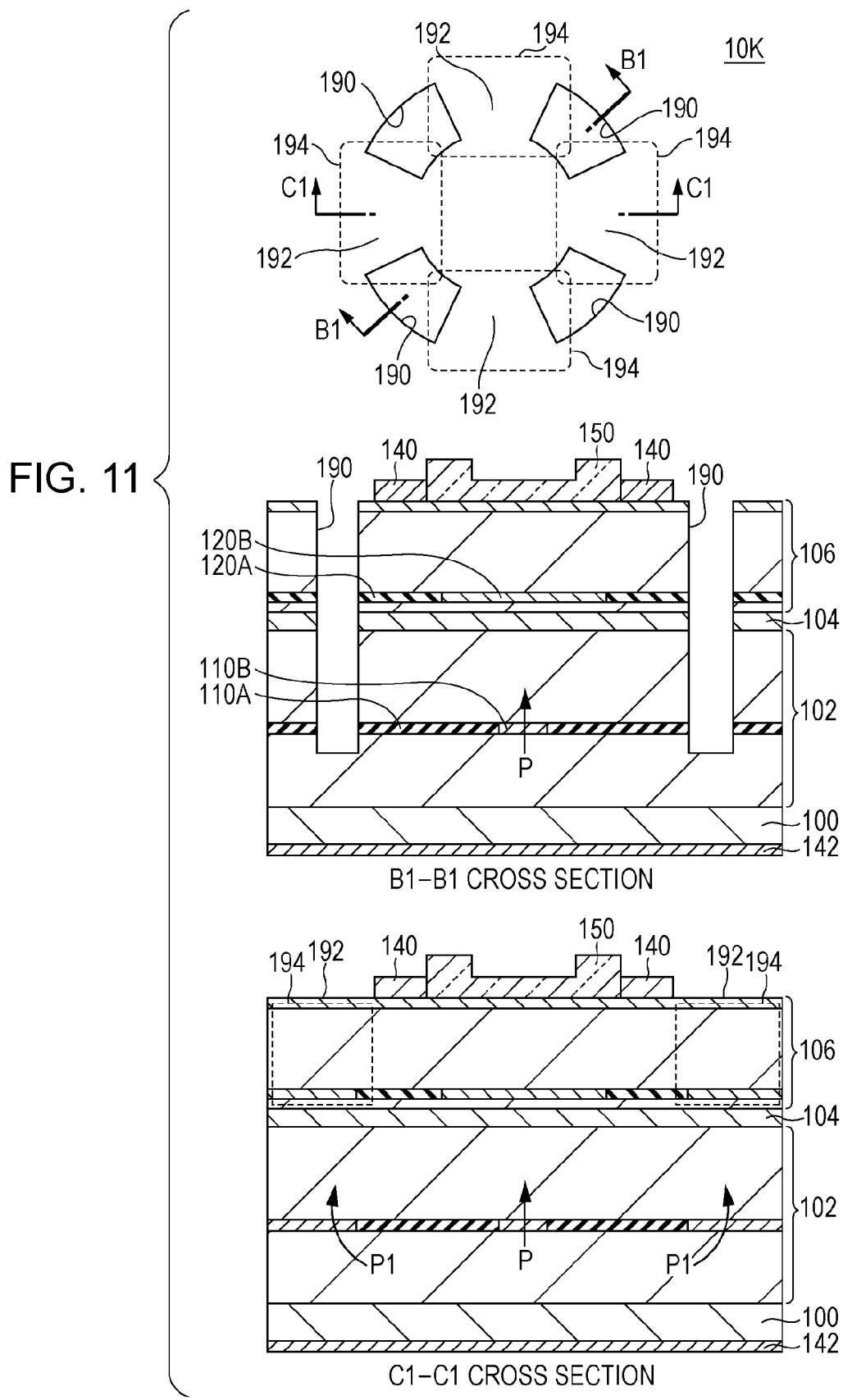
FIG. 11 involves a schematic plan view of a surface emitting semiconductor laser according to a twelfth exemplary embodiment of the present invention, and its cross sections.

FIG. 11 illustrates a VCSEL 10K according to a twelfth exemplary embodiment of the present invention. The VCSEL 10K according to the twelfth exemplary embodiment is hole (trench) type. Plural holes 190, for example, four holes 190 are desirably formed by etching the upper DBR 106 and the lower DBR 102. The plan shape of each hole 190 is a sector shape. The holes 190 are formed at an interval of about 90 degrees, and wide coupling portions 192 are formed between the holes. The first oxidation confinement layer 110 formed at the lower DBR 102 is formed at a position separated from the active region 104. The first and second oxidation confinement layers 110 and 120 are oxidized from a side exposed to the holes 190. Similarly to the first exemplary embodiment, the non-oxidation region 110B with the diameter Do1 and the non-oxidation region 120B with the diameter Do2 are formed. In the oxidation step, since the coupling portions 192 have relatively large gaps between the holes unlike the eleventh exemplary embodiment, the p-type AlAs and n-type AlAs of the coupling portions 192 are partly oxidized.

In the twelfth exemplary embodiment, since the first oxidation confinement layer 110 is formed at the position separated from the active region 104, a current path P1 passing along the side of the oxidation region 110A is formed in addition to a current path P passing through the non-oxidation region 110B. Accordingly, the resistance of the element is decreased. The coupling portions 182 have the large widths and part of the n-type AlAs is oxidized. Hence, the region which is not oxidized provides the current path P1. Also, to restrict leakage of current in the upper DBR 106 through the coupling portions 192, the resistance of part of the upper DBR 106 at the coupling portions 192 may be increased by proton ion implanting. In this case, by adjusting the implantation energy and dose quantity, the resistance of a desirable area of the coupling portions 192 (for example, areas indicated by broken lines in the drawing) may be increased. Further, the diameter Do1 of the non-oxidation region is increased as compared with a case in which the first oxidation confinement layer 110 is arranged close to the active region 104.

Figure 12:
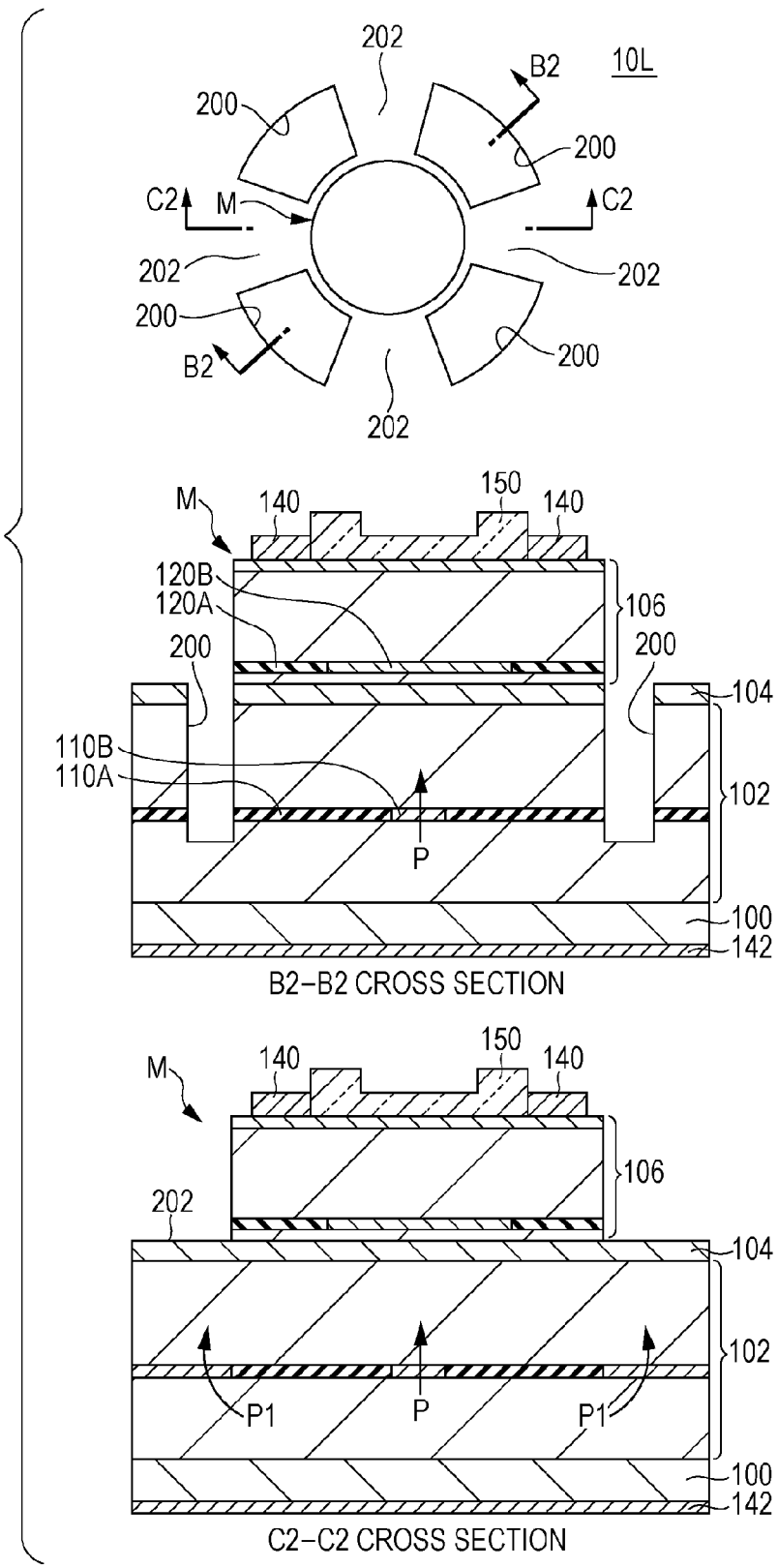
FIG. 12 involves a schematic plan view of a surface emitting semiconductor laser according to a thirteenth exemplary embodiment of the present invention, and its cross sections.

FIG. 12 illustrates a VCSEL 10L according to a thirteenth exemplary embodiment of the present invention. The VCSEL 10L according to the thirteenth exemplary embodiment is mesa (post)-hole (trench) type. A cylindrical mesa M is desirably formed by a depth to reach at least the second oxidation confinement layer 120, and four holes 200 are desirably formed around the mesa M by a depth to reach at least the first oxidation confinement layer 110. The holes 200 are formed by etching, and each have a sector plan shape. Wide coupling portions 202 are formed between the holes. In the oxidation step, the first oxidation confinement layer 110 is selectively oxidized from the side surface exposed to the holes 200, the second oxidation confinement layer 120 is selectively oxidized from the side surface exposed from the mesa M, and the non-oxidation regions 110B and 120B with the diameter Do1 and the diameter Do2 are formed.

Figure 13:
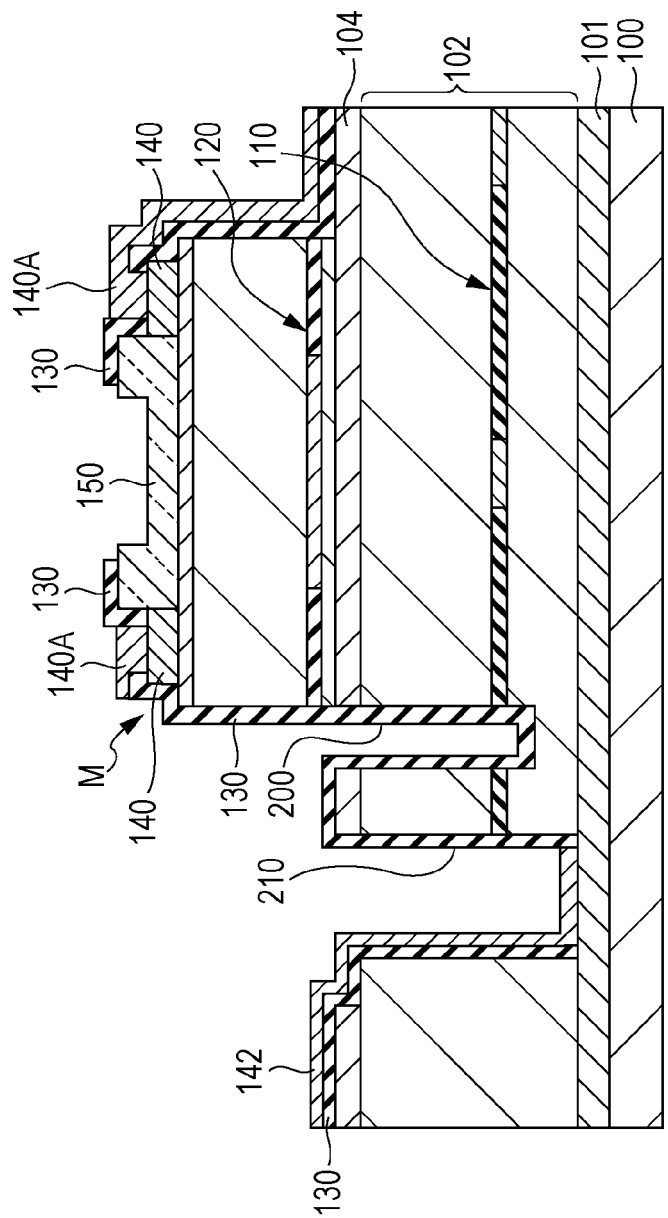
FIG. 13 is a schematic cross section of a surface emitting semiconductor laser according to a fourteenth exemplary embodiment of the present invention.

Even in the thirteenth exemplary embodiment, since the first oxidation confinement layer 110 is formed at the position separated from the active region 104, the current path P1 passing along the side of the oxidation region 110A is formed in addition to the current path P passing through the non-oxidation region 110B. Accordingly, the resistance of the element is decreased. Also, since the mesa structure is provided, the ions do not have to be implanted to the upper DBR 106 unlike the twelfth exemplary embodiment. FIG. 13 illustrates a VCSEL 10M according to a fourteenth exemplary embodiment of the present invention. In the VCSEL 10M according to the fourteenth exemplary embodiment, both the p-side electrode and n-side electrode are formed of surface electrodes. FIG. 13 illustrates an example, in which the VCSEL of mesa (post)-hole (trench) type according to the thirteenth exemplary embodiment is formed of the surface electrodes. As shown in the drawing, a buffer layer 101 made of an n-type GaAs or AlGaAs is formed on the GaAs substrate 100. In this case, the GaAs substrate may have a semi-insulating characteristic. Similarly to the above-described exemplary embodiment, the lower DBR 102, the active region 104, and the upper DBR 106 are stacked on the buffer layer 101. The first oxidation confinement layer 110 is formed in the lower DBR 102, and the second oxidation confinement layer 120 is formed in the upper DBR 106.

Also, a groove 210 is formed at the side of the bottom of the mesa M. The groove 210 has a depth to reach the buffer layer 101. The interlayer insulating film 130 is formed on the entire surface of the substrate including the mesa M. A contact hole that allows the buffer layer 101 to be exposed through the groove 210 is formed in the interlayer insulating film 130. The n-side electrode 142 is electrically connected with the buffer layer 101 through the contact hole. A ring-shaped contact hole that allows the p-side electrode 140 to be exposed is formed in the interlayer insulating film 130 at the top of the mesa M. An upper electrode 140A is connected with the p-side electrode 140 through the contact hole.

A manufacturing method of a VCSEL according to an exemplary embodiment of the present invention is described below. FIGS. 15A to 18L are schematic cross sections of manufacturing steps of the VCSEL according to the thirteenth exemplary embodiment of the present invention. The left cross section is taken along line B2-B2 with a hole, and the right cross section is taken along line C2-C2 without a hole.

Figure 15A:
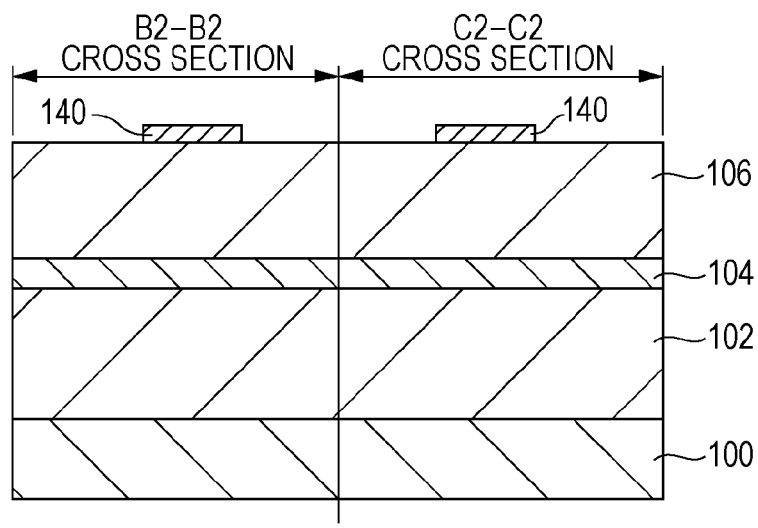
FIGS. 15A to 15C are schematic cross sections of manufacturing steps of the surface emitting semiconductor laser according to the thirteenth exemplary embodiment of the present invention.

As shown in FIG. 15A, the lower DBR 102, the active region 104, and the upper DBR 106 are formed on the n-type GaAs substrate 100 by metal-organic vapor phase epitaxy method (metal-organic chemical vapor deposition, MOCVD). Then, gold is deposited on the upper DBR 106 by liftoff, and hence the ring-shaped or substantially ring-shaped p-side electrode 140 is formed.

Figure 15B:
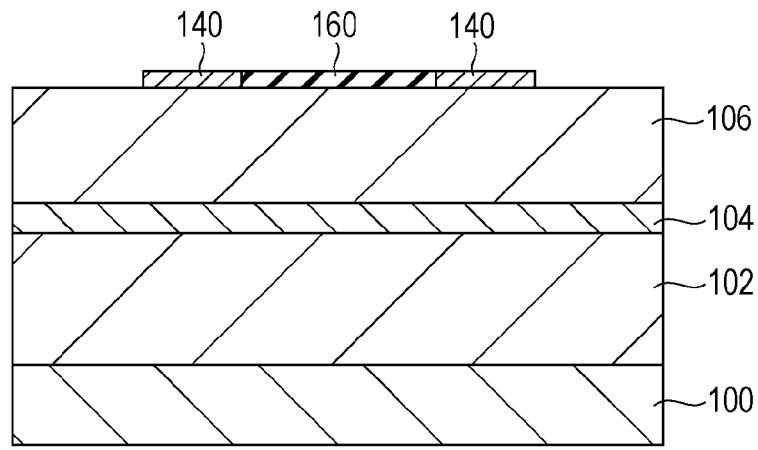
Figure 15C:
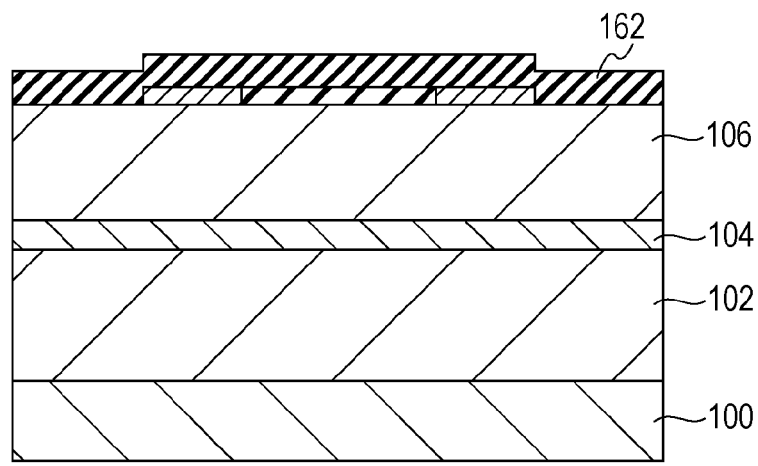

Then, as shown in FIG. 15B, a SiON film as the first reflectivity adjustment material 160 is deposited. The SiON film is patterned to cover the center portion of the ring-shaped or substantially ring-shaped p-side electrode 140 by a known photolithography step. The SiON film protects the light emitting opening and functions as the first reflectivity adjustment material 160. Then, as shown in FIG. 15C, the SiN film 162 is deposited to cover the entire surfaces of the p-side electrode 140 and the SiON film 160. The SiN film 162 functions as an etching mask in later steps, and partly functions as the second reflectivity adjustment material.

Figure 16D:
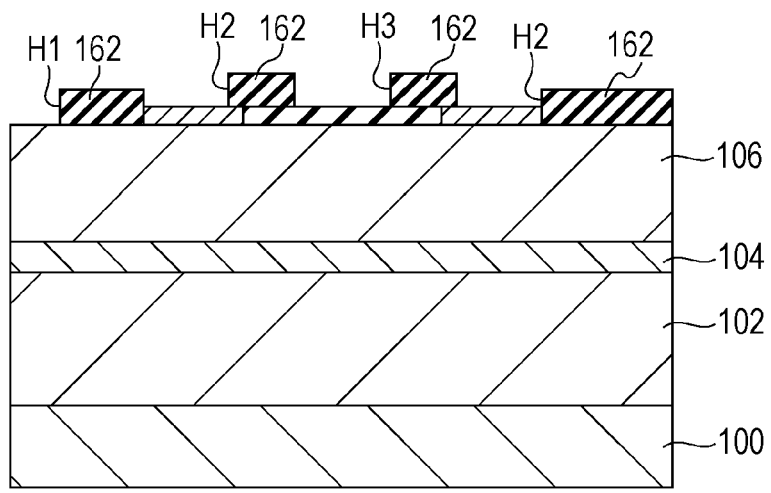
FIGS. 16D to 16F are schematic cross sections of manufacturing steps of the surface emitting semiconductor laser according to the thirteenth exemplary embodiment of the present invention.

Then, as shown in FIG. 16D, etching is performed on the SiN film 162 so that an opening H1 that allows the upper DBR 106 to be exposed, a ring-shaped opening H2 that allows the p-side electrode 140 to be exposed, and an opening H3 that allows the SiON film 160 to be exposed simultaneously. The SiON film 160 and the ring-shaped SiN film 162 formed thereon form the reflectivity adjustment member 150.

Figure 16E:
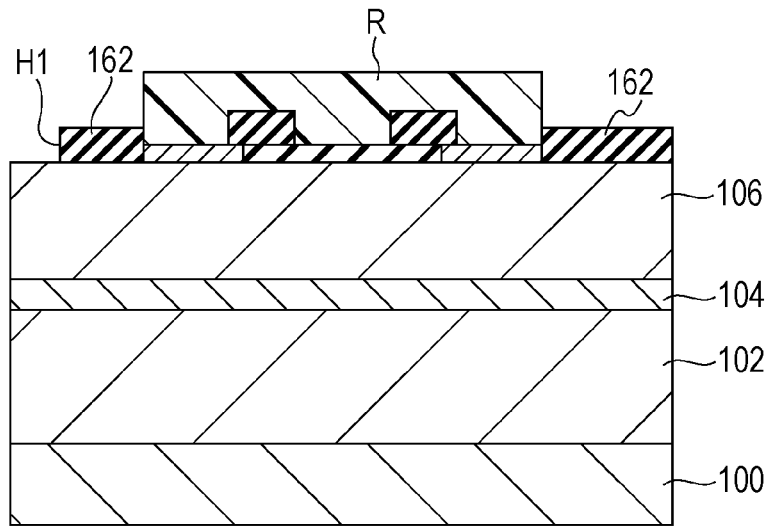
Figure 16F:
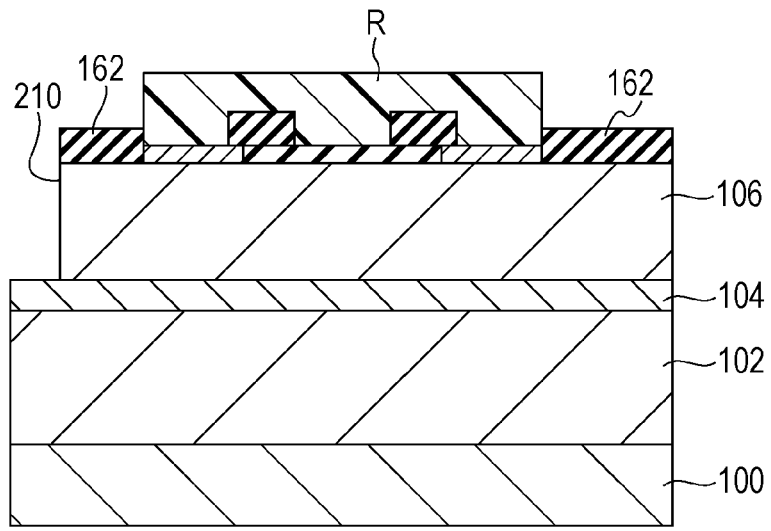

Then, as shown in FIG. 16E, a resist R patterned in a circular shape is formed to cover the openings H2 and H3. The opening H1 is exposed. Then, as shown in FIG. 16F, the resist R and the SiN film 162 present around the outer periphery of the resist R are used as masks, anisotropic etching is performed on the upper DBR 106 through the opening H1, and the trench (groove) 210 extending to the active region 104 is formed.

Figure 17G:
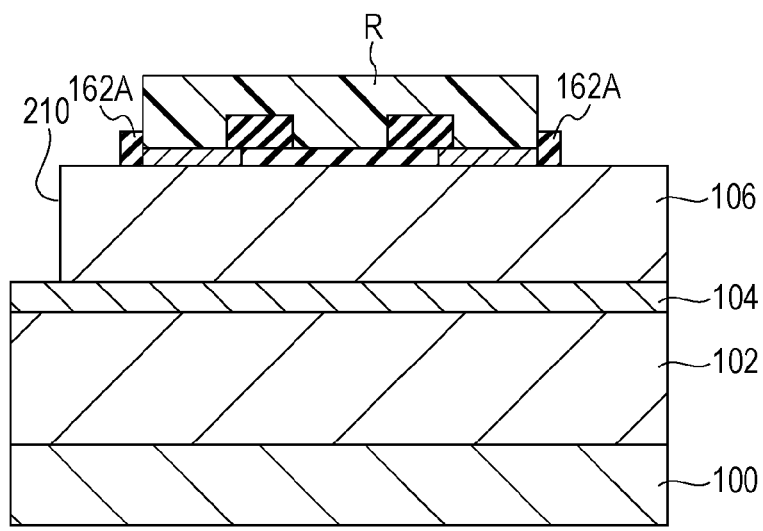
FIGS. 17G to 17I are schematic cross sections of manufacturing steps of the surface emitting semiconductor laser according to the thirteenth exemplary embodiment of the present invention.
Figure 17H:
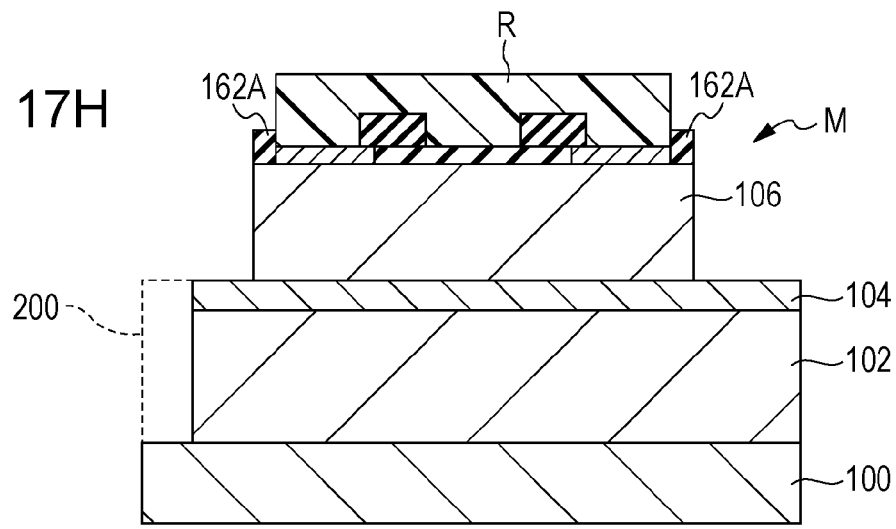

Then, as shown in FIG. 17G, the SiN film 162 present at the outer periphery of the resist R is partly removed by etching, and a ring-shaped remaining substance 162A is formed. Then, as shown in FIG. 17H, the resist R and the remaining substance 162A are used as masks for etching, and anisotropic etching is performed on the semiconductor layer. Thus, the cylindrical mesa M is formed on the substrate. Etching has to reach at least the second oxidation confinement layer. In the illustrated example, etching reaches the active region 104. Simultaneously with the etching, the hole 200 (see FIG. 12) is formed in the lower DBR 102 through the trench 210. The hole 200 is defined by a depth to reach the substrate 100.

Figure 17I:
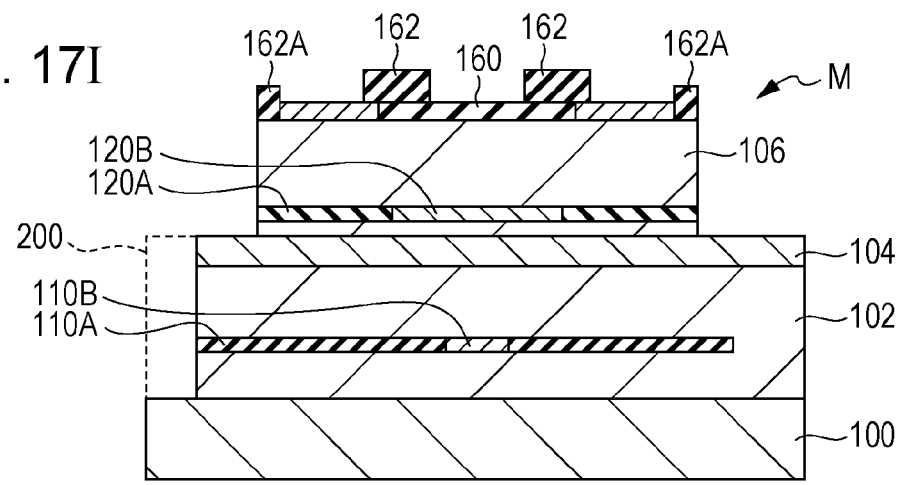

Then, as shown in FIG. 17I, the resist R is removed, and an oxidation step is performed. By the oxidation step, the first oxidation confinement layer 110 is formed in the lower DBR 102, and the second oxidation confinement layer 120 is formed in the upper DBR 106. When the non-oxidation region 110B of the first oxidation confinement layer 110 has the diameter Do1, the non-oxidation region 120B of the second oxidation confinement layer 120 is the diameter Do2, and the second reflectivity adjustment material 162 has the inner diameter Dn, the relationships of Do1<Do2 and Dn<Do2 or the relationship of Do1≤Dn<Do2 is satisfied.

Figure 18J:
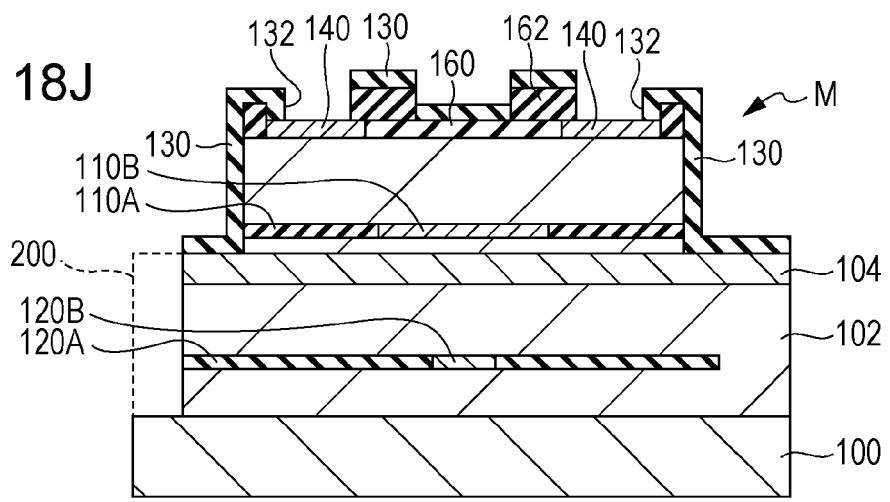
FIGS. 18J to 18L are schematic cross sections of manufacturing steps of the surface emitting semiconductor laser according to the thirteenth exemplary embodiment of the present invention.
Figure 18K:
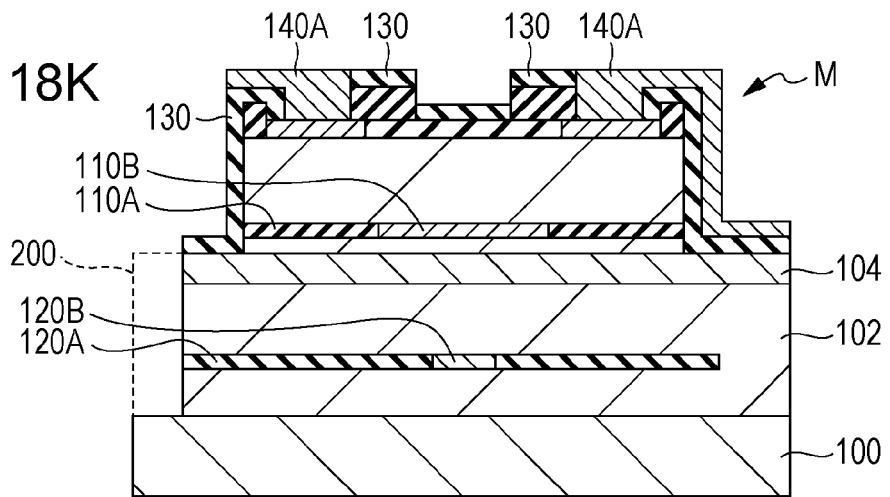

Then, as shown in FIG. 18J, the insulating film 130 is formed to cover the bottom, side, and top of the mesa M. A contact hole 132 is formed in the insulating film 130 at the top of the mesa. The contact hole 132 allows the p-side electrode 140 to be exposed. Unlike the VCSEL 10M shown in FIG. 13, the insulating film 130 covers the first reflectivity adjustment material 160 and the second reflectivity adjustment material 162 in this exemplary embodiment.

Figure 18L:
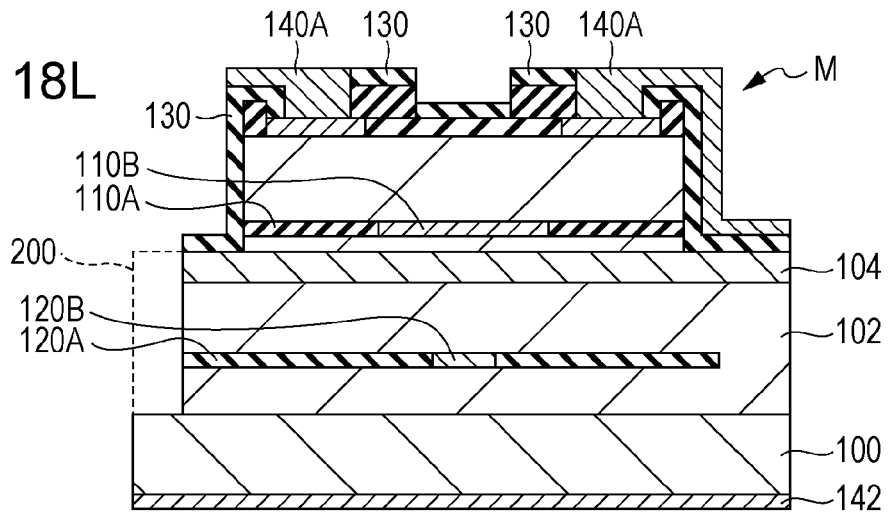

Then, the upper electrode 140A that is connected with the p-side electrode 140 is patterned by liftoff or the like. Then, as shown in FIG. 18L, the n-side electrode 142 is formed on the back surface of the substrate 100.

In the manufacturing steps D to I of this exemplary embodiment, the processing is performed in the same process so that the position of the diameter Dn of the center portion of the reflectivity adjustment member is aligned with the hole 200 for the trench of the oxidation confinement layer in the lower DBR 102. Hence, the processing is performed such that the center of the diameter Dn is constantly aligned with the center of the diameter Do1 of the non-oxidation region. The diameter Dn and the diameter Do are spontaneously aligned. If the center of the diameter Dn is deviated from the center of the diameter Do1, the deviation causes an optical loss to be generated and oscillation in a single mode is interrupted. Thus, both the members should be aligned with each other. In contrast, since the diameter Do2 of the first oxidation confinement layer 120 is larger than the diameter Do1 and the diameter Dn, a deviation is allowable by a certain degree.

Of course, the present invention may be formed of any of the above-described first to fourteenth exemplary embodiments. Also, the first to fourteenth exemplary embodiments may be combined or altered. The VCSEL according to any of the exemplary embodiments of the present invention has the wavelength range of 780 nm for example. However, the oscillation wavelength may be desirably determined, and the present invention may be applied to oscillation wavelengths from a short wavelength to a long wavelength. Such a VCSEL is widely used in a light source for a laser printer, a light source for optical communication, or a light source for optical sensing. In any of the above-described exemplary embodiments, the VCSEL of the GaAs type is used for example. However, the present invention may be applied to a VCSEL using other group III-V semiconductor. In any of the above-described exemplary embodiments, the VCSEL of a single spot is used for example. However, a multi-spot VCSEL or a VCSEL array in which multiple mesas (light-emitting portions) are formed on the substrate may be used.

Figure 19A:
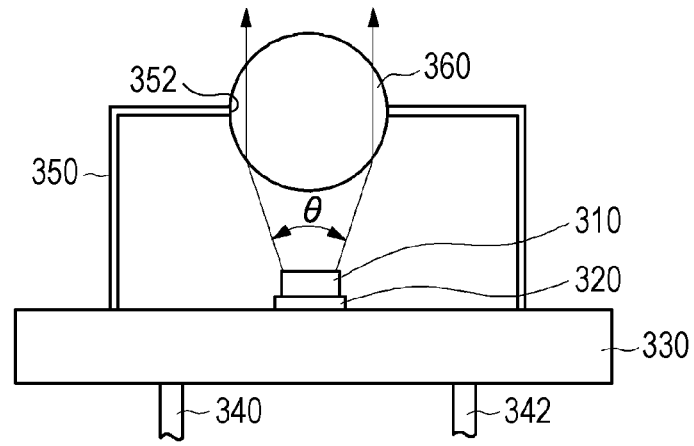
FIGS. 19A and 19B are schematic cross sections showing configurations of surface emitting semiconductor laser devices, in each surface emitting semiconductor laser device, an optical member being mounted on the surface emitting semiconductor laser according to any of the exemplary embodiments.

Next, a surface emitting semiconductor laser device, an optical information processor, and an optical transmitter using the VCSEL according to any of the exemplary embodiments are described with reference to the drawings. FIG. 19A is a cross section showing a configuration of a surface emitting semiconductor laser device 300 in which the VCSEL and an optical member are mounted (packaged). In the surface emitting semiconductor laser device 300, a chip 310 having the VCSEL is fixed onto a disk-shaped metal stem 330 through a conductive adhesive 320. Conductive leads 340 and 342 are inserted into through holes (not shown) formed in the stem 330. The one lead 340 is electrically connected with the n-side electrode of the VCSEL and the other lead 342 is electrically connected with the p-side electrode. A rectangular hollow cap 350 is fixed onto the stem 330 containing the chip 310. The cap 350 has an opening 352 at the center. A ball lens 360, which is the optical member, is fixed into the opening 352. The optical axis of the ball lens 360 is positioned to be substantially aligned with the center of the chip 310. When forward driving current is applied to the leads 340 and 342, laser light is emitted in a vertical direction from the chip 310. The distance between the chip 310 and the ball lens 360 is adjusted so that the ball lens 360 is arranged within a divergence angle θ of the laser light from the chip 310. Also, a light-receiving element or a temperature sensor for monitoring a light-emitting state of the VCSEL may be included in the cap.

Figure 19B:
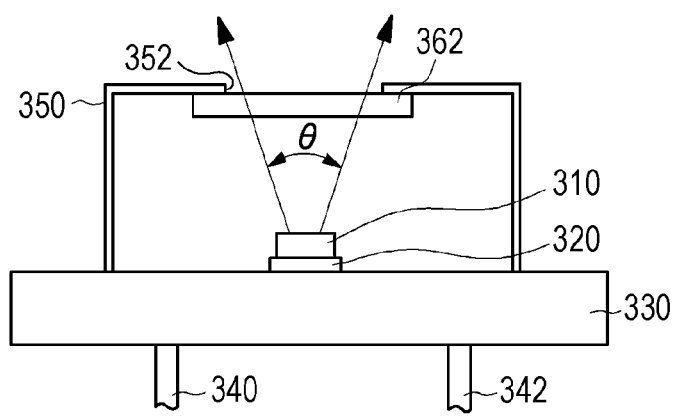

FIG. 19B illustrates a configuration of another surface emitting semiconductor laser device 302. The surface emitting semiconductor laser device 302 includes a flat glass plate 362 fixed at an opening 352 at the center of the cap 350, instead of using the ball lens 360. The center of the flat glass plate 362 is positioned to be substantially aligned with the center of the chip 310. The distance between the chip 310 and the flat glass plate 362 is adjusted such that the opening diameter of the flat glass plate 362 is equal to or larger than the divergence angle θ of the laser light from the chip 310.

Figure 20:
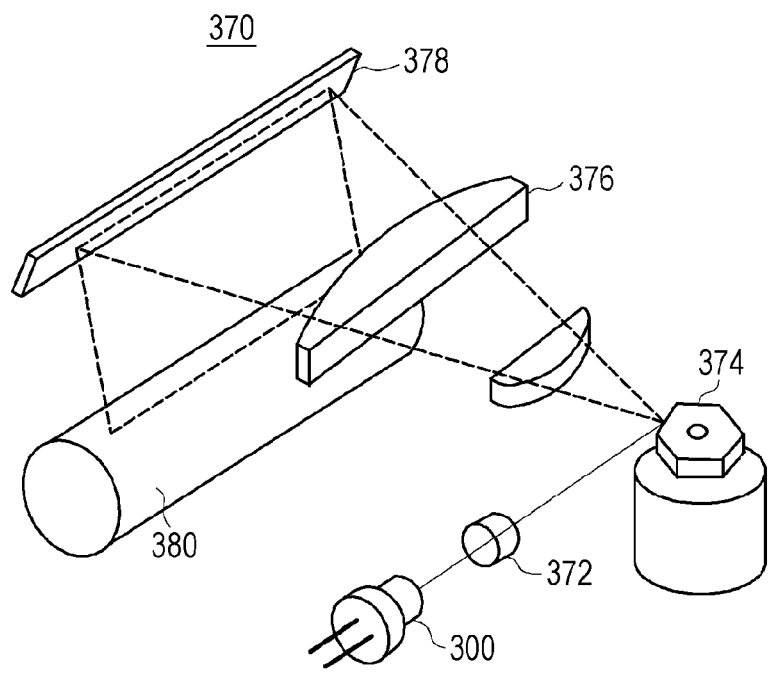
FIG. 20 illustrates a configuration example of a light source device using the surface emitting semiconductor laser according to any of the exemplary embodiments.

FIG. 20 illustrates an example in which the VCSEL is applied to a light source of an optical information processor 370. The optical information processor 370 includes a collimator lens 372 that receives the laser light from the surface emitting semiconductor laser device 300 or 302 with the VCSEL mounted as shown in FIG. 19A or 19B; a polygonal mirror 374 that rotates at a constant speed and reflects a bundle of light rays from the collimator lens 372 at a constant divergence angle; an f-θ lens 376 that receives the laser light from the polygonal mirror 374 and radiates a reflecting mirror 378 with light; the line-shaped reflecting mirror 378; and a photoconductor drum (a recording medium) 380 that forms a latent image in accordance with reflection light from the reflecting mirror 378. As described above, the VCSEL may be used as a light source in an optical information processor, such as a copier or a printer, which includes an optical system that collects the laser light from the VCSEL onto the photosensitive drum, and a mechanism that causes the collected laser light to scan on the photoconductor drum.

Figure 21:
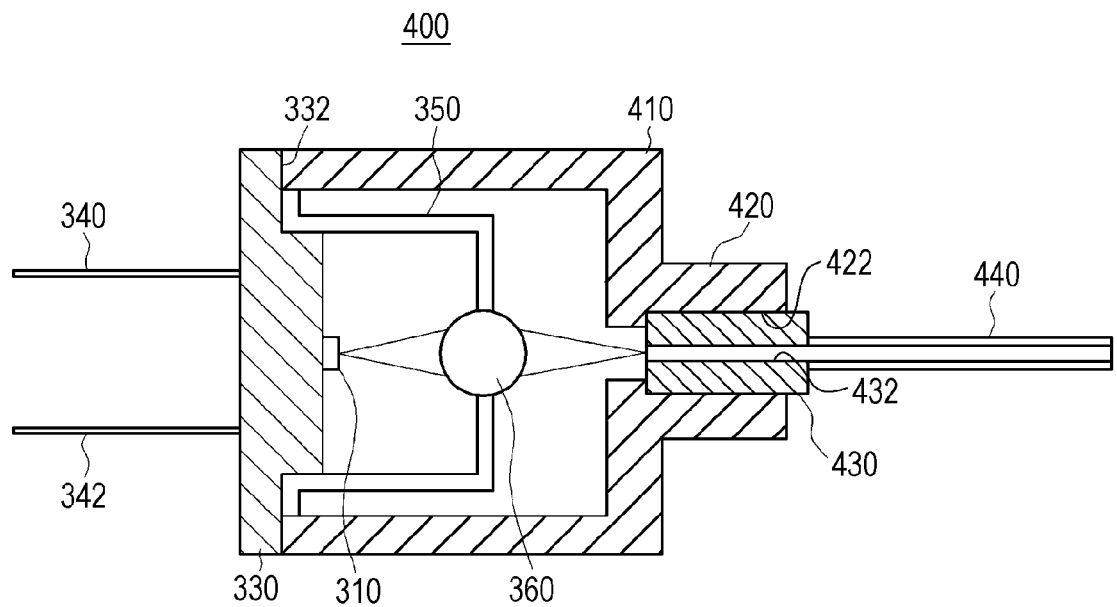
FIG. 21 is a schematic cross section showing a configuration of an optical transmitter using the surface emitting semiconductor laser device shown in FIG. 19A.

FIG. 21 is a cross section showing a configuration of an optical transmitter 400 when the surface emitting semiconductor laser device shown in FIG. 19A is applied to the optical transmitter. The optical transmitter 400 includes a cylindrical housing 410 fixed to the stem 330, a sleeve 420 integrally formed at an end surface of the housing 410, a ferrule 430 held within an opening 422 of the sleeve 420, and an optical fiber 440 held by the ferrule 430. An end of the housing 410 is fixed to a flange 332 formed in the circumferential direction of the stem 330. The ferrule 430 is accurately positioned at the opening 422 of the sleeve 420. The optical axis of the optical fiber 440 is aligned with the optical axis of the ball lens 360. The core wire of the optical fiber 440 is held within a through hole 432 of the ferrule 430. The laser light emitted from the surface of the chip 310 is collected by the ball lens 360. The collected light incidents on the core wire of the optical fiber 440 and is transmitted. In the above-described example, the ball lens 360 is used. However, other lens, such as a biconvex lens or a planoconvex lens, may be used. Further, the optical transmitter 400 may include a drive circuit that applies an electric signal to the leads 340 and 342. Further, the optical transmitter 400 may include a receiving function that receives an optical signal through the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface emitting semiconductor laser, comprising:
a substrate;
a first semiconductor distributed bragg reflector of a first conductive type formed on the substrate;
an active region formed on the first semiconductor distributed bragg reflector;
a second semiconductor distributed bragg reflector of a second conductive type formed on the active region;
a current confinement layer that confines current flowing in the active region;
an optical confinement layer that confines light generated in the active region; and
an optical loss unit that is provided in addition to the current confinement layer and the optical confinement layer, includes a center portion and a periphery portion in a predetermined direction, and gives a larger optical loss to the periphery portion than an optical loss given to the center portion,
wherein $Do1<Do2$ and $Dn<Do2$ are satisfied, where $Do1$ is a width of an optical confinement region of the optical confinement layer in the predetermined direction, $Do2$ is a width of a current confinement region of the current confinement layer in the predetermined direction, and $Dn$ is a width of the center portion of the optical loss unit in the predetermined direction.

2. The surface emitting semiconductor laser according to claim 1, wherein $Do1 \leq Dn < Do2$ is satisfied.

3. The surface emitting semiconductor laser according to claim 1, wherein the optical loss unit is formed in a light emitting region on the second semiconductor distributed bragg reflector.

4. The surface emitting semiconductor laser according to claim 1, wherein the current confinement layer and the optical confinement layer are formed by selectively oxidizing semiconductor layers.

5. The surface emitting semiconductor laser according to claim 1,
wherein the current confinement layer is formed by implanting an ion to a semiconductor layer, and
wherein the optical confinement layer is formed by selectively oxidizing a semiconductor layer.

6. The surface emitting semiconductor laser according to claim 1,
wherein the current confinement layer includes a tunnel junction region, and
wherein the optical confinement layer is formed by selectively oxidizing a semiconductor layer.

7. The surface emitting semiconductor laser according to claim 1, wherein the optical loss unit decreases a reflectivity of the periphery portion by a larger value as compared with a reflectivity of the center portion.

8. The surface emitting semiconductor laser according to claim 1, wherein the optical loss unit includes at least a dielectric film formed on the second semiconductor distributed bragg reflector.

9. The surface emitting semiconductor laser according to claim 1, wherein the optical loss unit is formed by etching at least a topmost layer of the second semiconductor distributed bragg reflector.

10. The surface emitting semiconductor laser according to claim 1, wherein the optical loss unit includes a metal film formed on the second semiconductor distributed bragg reflector.

11. The surface emitting semiconductor laser according to claim 1,
wherein a substantially columnar structure is formed on the substrate,
wherein the current confinement layer and the optical confinement layer are formed in the substantially columnar structure, and
wherein the optical loss unit is formed at a top of the substantially columnar structure.

12. The surface emitting semiconductor laser according to claim 1,
wherein a plurality of holes extending from the second semiconductor distributed bragg reflector to the first semiconductor distributed bragg reflector are formed, and
wherein the current confinement layer and the optical confinement layer include an oxidation region that is selectively oxidized through the holes.

13. The surface emitting semiconductor laser according to claim 1,
wherein a substantially columnar structure is formed on the substrate by removing the second semiconductor distributed bragg reflector,
wherein a plurality of holes are formed in the first semiconductor distributed bragg reflector exposed from the substantially columnar structure,
wherein the current confinement layer includes an oxidation region that is selectively oxidized from a side surface exposed from the substantially columnar structure, and
wherein the optical confinement layer includes an oxidation region that is selectively oxidized through the holes.

14. The surface emitting semiconductor laser according to claim 1,
wherein the optical confinement layer is formed in the first semiconductor distributed bragg reflector,
wherein the current confinement layer is formed in the second semiconductor distributed bragg reflector, and
wherein a distance from the active region to the optical confinement layer is larger than a distance from the active region to the current confinement layer.

15. The surface emitting semiconductor laser according to claim 1, wherein the width Do1 of the optical confinement layer is a size that causes oscillation in a fundamental transverse mode.

16. A surface emitting semiconductor laser device, comprising:
the surface emitting semiconductor laser according to claim 1, and
an optical member, light from the surface emitting semiconductor laser being incident on the optical member.

17. An optical transmitter, comprising:
the surface emitting semiconductor laser device according to claim 16, and
a transmitting unit that transmits laser light emitted from the surface emitting semiconductor laser device through an optical medium.

18. An information processor, comprising:
the surface emitting semiconductor laser according to claim 1,
a light collecting unit that collects laser light emitted form the surface emitting semiconductor laser on a recording medium, and
a mechanism that causes the laser light collected by the light collecting unit to scan on the recording medium.

19. A manufacturing method of a surface emitting semiconductor laser, the surface emitting semiconductor laser including
a substrate,
a first semiconductor distributed bragg reflector of a first conductive type formed on the substrate,
an active region formed on the first semiconductor distributed bragg reflector, and
a second semiconductor distributed bragg reflector of a second conductive type formed on the active region,
the method comprising:
forming a substantially ring-shaped electrode having an opening on the second semiconductor distributed bragg reflector;
forming a first dielectric film that covers the opening of the electrode;
forming a second dielectric film that covers the first dielectric film;
forming a first opening that allows the second semiconductor distributed bragg reflector to be exposed and a second opening that allows the first dielectric film to be exposed, in the second dielectric film by etching the second dielectric film;
forming a substantially columnar structure on the substrate by etching at least the second semiconductor distributed bragg reflector while using at least the second dielectric film that defines the first opening as a mask;
forming a current confinement layer that confines current flowing in the active region by selectively oxidizing a semiconductor layer of the second semiconductor distributed bragg reflector from a side surface of the substantially columnar structure; and
forming an optical confinement layer in the first semiconductor distributed bragg reflector, the optical confinement layer confining light generated in the active region,
wherein Do1<Do2 and Dn<Do2 are satisfied, where Do1 is a width of an optical confinement region of the optical confinement layer in a predetermined direction, Do2 is a width of a current confinement region of the current confinement layer in the predetermined direction, and Dn is a width of the second opening of the second dielectric layer in the predetermined direction, and
wherein a reflectivity of a region of the first dielectric film covered with the second dielectric film is lower than a reflectivity of a region of the first dielectric film not covered with the second dielectric film.

20. The manufacturing method according to claim 19,
wherein the forming the optical confinement layer includes
forming a plurality of holes in the first semiconductor distributed bragg reflector, and
forming the optical confinement layer that is selectively oxidized in the first semiconductor distributed bragg reflector through the plurality of holes, and
wherein the optical confinement layer and the current confinement layer are simultaneously formed.

* * * * *